US009595920B2

(12) United States Patent
Li et al.

(10) Patent No.: US 9,595,920 B2
(45) Date of Patent: Mar. 14, 2017

(54) HARDWARE-EFFICIENT COMPENSATOR FOR OUTPHASING POWER AMPLIFIERS

(71) Applicant: Massachusetts Institute of Technology, Cambridge, MA (US)

(72) Inventors: Yan Li, Cambridge, MA (US); Zhipeng Li, Cambridge, MA (US); Alexandre Megretski, Concord, MA (US); Vladimir Marko Stojanovic, Lexington, MA (US); Omer Tanovic, Cambridge, MA (US); Yehuda Avniel, Cambridge, MA (US)

(73) Assignee: Massachusette Institute of Technology, Cambridge, MA (US)

( * ) Notice: Subject to any disclaimer, the term of this patent is extended or adjusted under 35 U.S.C. 154(b) by 0 days.

(21) Appl. No.: 14/760,284

(22) PCT Filed: Mar. 13, 2014

(86) PCT No.: PCT/US2014/025407
§ 371 (c)(1),
(2) Date: Jul. 10, 2015

(87) PCT Pub. No.: WO2014/151302
PCT Pub. Date: Sep. 25, 2014

(65) Prior Publication Data
US 2015/0357975 A1 Dec. 10, 2015

Related U.S. Application Data

(60) Provisional application No. 61/804,428, filed on Mar. 22, 2013.

(51) Int. Cl.
*H03F 3/68* (2006.01)
*H03F 1/02* (2006.01)
(Continued)

(52) U.S. Cl.
CPC ......... *H03F 1/0205* (2013.01); *H03F 1/0277* (2013.01); *H03F 1/0294* (2013.01);
(Continued)

(58) Field of Classification Search
CPC .... H03F 1/0205; H03F 1/0277; H03F 1/0294; H03F 1/223; H03F 1/3241;
(Continued)

(56) References Cited

U.S. PATENT DOCUMENTS 6,054,894 A * 4/2000 Wright ................. H03F 1/0294
330/124 R
7,356,315 B2 * 4/2008 Zipper ..................... H03C 5/00
330/124 R
(Continued)

OTHER PUBLICATIONS

Lim et al., "Compensation of Path Imbalance in LINC Transmitters using EVM and ACPR Look up Tables", Proceedings of Asia-Pacific Microwave Conference 2010, TH3G-08, pp. 1296-1299.*
(Continued)

*Primary Examiner* — Steven J Mottola
*Assistant Examiner* — Hafizur Rahman
(74) *Attorney, Agent, or Firm* — Daly, Crowley, Mofford & Durkee, LLP

(57) ABSTRACT

Digital compensators for use in outphasing-based power amplification systems (e.g., Linear Amplification using Non-linear Components (LINC) amplifiers and Asymmetric Multilevel Outphasing (AMO) amplifiers) include a short memory nonlinear portion and a long memory linear time invariant (LTI) portion. In various embodiments, compensators are provided that are of relatively low complexity and that are capable of operation at throughputs exceeding a Gigasample per second.

28 Claims, 34 Drawing Sheets

(51) Int. Cl.
| | |
|---|---|
| H03F 3/19 | (2006.01) |
| H03F 3/21 | (2006.01) |
| H03F 1/22 | (2006.01) |
| H03F 1/32 | (2006.01) |
| H04L 25/03 | (2006.01) |
| H04L 27/36 | (2006.01) |

(52) U.S. Cl.
CPC ............ *H03F 1/223* (2013.01); *H03F 1/3241* (2013.01); *H03F 3/19* (2013.01); *H03F 3/211* (2013.01); *H04L 25/03834* (2013.01); *H04L 27/368* (2013.01); *H03F 2200/451* (2013.01); *H03F 2203/21112* (2013.01)

(58) Field of Classification Search
CPC ...... H03F 3/19; H03F 3/211; H03F 2200/451; H03F 2203/21112; H04L 25/03834; H04L 27/368
USPC .... 330/84, 124 R, 295, 149, 51, 2; 327/355; 375/297, 300, 320; 455/102, 127.1
See application file for complete search history.

(56) References Cited

U.S. PATENT DOCUMENTS

| | | | |
|---|---|---|---|
| 7,529,652 | B1 | 5/2009 | Gahinet et al. |
| 8,451,053 | B2* | 5/2013 | Perreault ............... H03F 1/0294 330/124 R |
| 9,020,453 | B2* | 4/2015 | Briffa .................. H03G 3/3042 330/124 R |
| 2008/0285681 | A1* | 11/2008 | Sorrells ................ H03F 1/0294 375/297 |
| 2010/0321107 | A1* | 12/2010 | Honcharenko ....... H03F 1/3247 330/124 R |
| 2011/0135035 | A1* | 6/2011 | Bose ........................ H04L 27/36 375/300 |
| 2011/0187437 | A1 | 8/2011 | Perreault et al. |
| 2011/0273234 | A1 | 11/2011 | Van der Heijden et al. |
| 2012/0154033 | A1 | 6/2012 | Lozhkin |
| 2012/0176195 | A1 | 7/2012 | Dawson et al. |
| 2012/0286985 | A1 | 11/2012 | Chandrasekaran et al. |
| 2012/0293252 | A1 | 11/2012 | Sorrells et al. |
| 2015/0124907 | A1* | 5/2015 | Li ........................ H03F 1/0294 375/320 |

OTHER PUBLICATIONS

Aguirre, et al.; "On the interpretation and practice of dynamical differences between Hammerstein and Wiener model;" IEEE Proceedings on Control Theory Appl.; vol. 152; No. 4; Jul. 2005; pp. 349-356.

Bosch, et al.; "Measurement and Simulation of Memory Effects in Predistortion Linearizers;" IEEE Transactions on Microwave Theory and Techniques; vol. 37; No. 12; Dec. 1989; pp. 1885-1890.

Cavers; "Amplifier Linearization Using a Digital Predistorter with Fast Adaption and Low Memory Requirements;" IEEE Transactions on Vehicular Technology: Vo. 39; No. 4; Nov. 1990; pp. 374-382.

D'Andrea et al.; "Nonlinear Predistortion of OFDM Signals over Frequency-Selective Fading Channels;" IEEE Transactions on Communications; vol. 49; No. 5; May 2001; pp. 837-843.

Hong, et al.; "Weighted Polynomial Digital Predistortion for Low Memory Effect Doherty Power Amplifier;" IEEE Transactions on Microwave Theory and Techniques; vol. 55; No. 5; May 2007; pp. 925-931.

Lajoinie, et al.; "Efficient Simulation of NPR for the Optimum Design of Satellite Transponders SSPAs;" EEE MTT-S International; vol. 2; Jun. 1998; pp. 741-744.

Li, et al.; "High-Throughput Signal Component Separator for Asymmetric Muli-Level Outphasing Power Amplifiers;" IEEE Journal of Solid-State Circuits; vol. 48; No. 2; Feb. 2013; pp. 369-380-.

Morgan, et al.; "A Generalized Memory Polynomial Model for Digital Predistortion of RF Power Amplifiers;" IEEE Transactions on Signal Processing; vol. 54; No. 10; Oct. 2006; pp. 3852-3860.

Panigada, et al.; "A 130 mW 100 MS/s Pipelined ADC with 69 SNDR Enabled by Digital Harmonic Distortion Correction;" IEEE Journal of Solid-State Circuits; vol. 44; No. 12; Dec. 2009; pp. 3314-3328.

Sevic, et al.; "A Novel Envelope-Terminal Load-Pull Method for ACPR Optimization of RF/Microwave Power Amplifiers;" IEEE MTT-S International; vol. 2; Jun. 1998: pp. 723-726.

Tai, "Efficient Watt-Level Power Amplifiers in Deeply Scaled CMOS;" Ph.D. Dissertification; Carnegie Mellon University; May 2011; 129 pages.

Yu, et al.; "Band-Limited Volterra Series-Based Digital Predistortion for Wideband RF Power Amplifiers;" IEEE Transactions on Microwave Theory and Techniques; vol. 60; No. 12; Dec. 2012; pp. 4198-4208.

Zhang, et al.; "Linearity Performance of Outphasing Power Amplifier Systems;" Design of Linear Outphasing Power Amplifiers; Google e-book; 2003; Retrieved on Jun. 13, 2014; Retrieved from Internet <URL: http://www.artechhouse.com/uploads/public/documents/chapters/Zhang-Larson_CH2.pdf>; pp. 35-85.

Zhu, et al.; "Digital Predistortion for Envelope-Tracking Power Amplifiers Using Decomposed Piecewise Volterra Series;" IEEE Transactions on Microwave Theory and Techniques; vol. 56; No. 10; Oct. 2008; pp. 2237-2247.

International Search Report of the ISA for PCT/US2014/025407 dated Jun. 24, 2014.

Written Opinion of the ISA for PCT/US2014/025407 dated Jun. 24, 2014.

PCT International Preliminary Report on Patentability of the ISA for PCT/US2014/025407 dated Oct. 1, 2015.

* cited by examiner

HARDWARE-EFFICIENT COMPENSATOR FOR OUTPHASING POWER AMPLIFIERS

This application is a U.S. National Stage of PCT application PCT/US2014/025407 filed in the English language on Mar. 13, 2014, and entitled "HARDWARE-EFFICIENT COMPENSATOR FOR OUTPHASING POWER AMPLIFIERS," which claims the benefit under 35 U.S.C. §119 of provisional application No. 61/804,428 filed Mar. 22, 2013, which application is hereby incorporated herein by reference in its entirety.

FIELD

Subject matter described herein relates to radio frequency (RF) amplifiers and, more particularly, to techniques, systems, and circuits for improving linearity in RF amplifiers.

BACKGROUND

As is known in the art, many modern high-throughput communication systems combine increased signaling rates with relatively complex modulation schemes to, for example, enhance spectral efficiency. In such systems, linear operation can be very important. Operational efficiency is also highly desirable in modern communication systems, particularly in applications that utilize depletable power sources (e.g., battery powered devices, etc.). To achieve high efficiency and linear operation, outphasing power amplifiers may be employed. However, the linearity levels achieved by outphasing power amplifiers often fall short of the levels desired for some modulation schemes. Techniques, circuits, and systems are therefore desirable that are capable of improving the efficiency of outphasing-type power amplifiers.

SUMMARY

Described herein are techniques, circuits, and systems that may be used to improve the linearity of operation of outphasing type power amplifiers and the systems that use them. The techniques, circuits, and systems may be used in any application that uses outphasing type power amplifiers including, for example, communication systems and others. In some embodiments, digital compensation circuits are provided for use in providing digital pre-distortion in outphasing amplifiers. These digital compensation circuits (or "compensators") may be used, for example, to adjust the input phases applied to two power amplifiers within an outphasing power amplification system in substantially real time to linearize operation of the system. The compensation circuits are capable of being implemented in a relatively compact form that are much more hardware efficient than conventional Volterra-type predistorters. The compensation circuits may also be constructed in a manner that consumes relatively little space on a chip and that consumes relatively little power compared to prior compensation techniques. As will be described in greater detail, the design of these compensation circuits was based upon the results of a detailed analysis of the non-linearities that are typically present within an outphasing type power amplifier.

In some embodiments, compensation circuits are provided that are capable of achieving very high throughputs (e.g., throughputs well into the multi-GigaSamples per second range in some instances). Thus, the circuits have application in a wide variety of different high speed radio frequency (RF) communication applications. This may include, for example, cellular telephone applications (e.g., base stations, handheld communicators, etc.), wireless networking applications (e.g., Wi-Fi, WiMax, etc.), satellite communications applications, emerging mm-wave short-range 60 GHz wireless applications, high speed imaging applications, automotive radar applications, and/or others. In some implementations, high throughput may be achieved while still consuming relatively little space and power.

Also described herein are a set of procedures and design steps that may be used to implement the above-described compensation circuits for outphasing power amplifiers.

Current state-of-the-art predistortion techniques are generally based on look-up tables (which can deal mostly with very short memory or memory-less nonlinearities) or Volterra-based equalizer templates. Both approaches require very large complexity to deal with long memory effects that are presented by the nature of the outphasing amplifier nonlinearities. At sample rates above 100 Mega-samples per second (MS/s), the memory effects are so severe that these previous predistortion approaches are typically difficult to impossible to perform in real-time without significantly degrading the power-added efficiency of the transmitter.

As mentioned above, by carefully studying the nature of the nonlinearities of an outphasing power amplifier, it has been discovered that it is possible to design a compensator that is partitioned into a special long-memory linear time invariant portion and a short-memory nonlinear portion in a manner that significantly reduces hardware complexity. In addition to this special compensator structure, also described herein are modifications that may be made to a shaping filter in an outphasing amplifier that can be used to improve the compensator's performance. That is, in some embodiments, shaping filters are used that provide, in addition to traditional functions, either zero-avoidance or level-avoidance functionality which has been found to increase the performance of the digital compensators.

In accordance with one aspect of the concepts, systems, circuits, and techniques described herein, an outphasing power amplification system comprises one or more of: an input to receive a data sequence; a shaping filter to shape pulses within the data sequence to control a spectrum thereof; a signal component separator (SCS) to separate the shaped data sequence into first and second signal components, the first signal component including at least a first phase signal and the second signal component including at least a second phase signal; first and second power amplifiers to amplify the first and second signal components, respectively; a combiner to combine output signals of the first and second power amplifiers to generate an output signal of the outphasing power amplification system; a compensator circuit coupled between the SCS and the first and second power amplifiers to adjust phases in the first phase signal and the second phase signal in a manner that linearizes operation of the outphasing power amplification system; and a phase modulator coupled between the compensator and the first and second power amplifiers to modulate carrier signals using the compensated first and second phase signals, wherein the phase modulator is coupled to deliver the modulated carrier signals to respective ones of the first and second power amplifiers; wherein the compensator circuit includes a first stage and a second stage, the first stage to provide non-linear transformations to the first and second signal components generated by the SCS and the second stage to provide linear time invariant (LTI) transformations to the output signals of the first stage, the LTI transformations having discontinuities at $\pm\pi$, wherein the second stage outputs the compensated first and second phase signals to the phase modulator.

In one embodiment, the first stage of the compensator circuit includes relatively short memory and the second stage of the compensator circuit includes relatively long memory.

In one embodiment, the first stage of the compensator circuit includes first circuitry to provide a first non-linear transformation to the first signal component and second circuitry to provide a second non-linear transformation to the second signal component; and the second stage includes third circuitry having at least one complex-valued finite impulse response (FIR) filter to process signals received from the first circuitry of the first stage and at least one complex valued FIR filter to process signals received from the second circuitry of the first stage.

In one embodiment, the first signal component includes the first phase signal and a first amplitude signal and the second signal component includes the second phase signal and a second amplitude signal; the first circuitry includes a tapped delay line having at least one tap to delay an amplitude value of the first amplitude signal and a phase value of the first phase signal to generate at least one previous amplitude value and at least one previous phase value, wherein the first non-linear transformation acts upon the amplitude value of the first amplitude signal, the phase value of the first phase signal, the at least one previous amplitude value of the first amplitude signal, and the at least one previous phase value of the first phase signal; and the second circuitry includes a tapped delay line having at least one tap to delay an amplitude value of the second amplitude signal and a phase value of the second phase signal to generate at least one previous amplitude value and at least one previous phase value, wherein the second non-linear transformation acts upon the amplitude value of the second amplitude signal, the phase value of the second phase signal, the at least one previous amplitude value of the second amplitude signal, and the at least one previous phase value of the second phase signal.

In one embodiment, the third circuitry includes a first upsampler to upsample signals received from the first circuitry of the first stage and a second upsampler to upsample signals received from the second circuitry of the first stage, wherein a first complex-valued FIR filter is coupled to an output of the first upsampler and a second complex-valued FIR filter is coupled to an output of the second upsampler.

In one embodiment, the outphasing power amplification system further comprises: a first summer to sum real components output by the first and second complex-valued FIR filters; a first low pass filter to filter an output signal of the first summer; a first downsampler to downsample an output signal of the first low pass filter; a second summer to sum imaginary components output by the first and second complex-valued FIR filters; a second low pass filter to filter an output signal of the second summer; and a second downsampler to downsample an output signal of the second low pass filter.

In one embodiment, the first and second complex-valued FIR filters include short tap filters and the first and second low pass filters include long tap filters.

In one embodiment, the first and second low pass filters include brick wall filters.

In one embodiment, the first circuitry includes circuitry to provide multiple different non-linear transformations to the first signal component and the second circuitry includes circuitry to provide multiple different non-linear transformations to the second signal component, the multiple different non-linear transformations to account for different modes.

In one embodiment, the first circuitry implements the first non-linear transformation as a piecewise linear approximation in two dimensions and the second circuitry implements the second non-linear transformation as a piecewise linear approximation in two dimensions.

In one embodiment, the first circuitry implements the first non-linear transformation using trigonometric polynomials and the second circuitry implements the second non-linear transformation using trigonometric polynomials.

In one embodiment, the compensation circuit is capable of achieving multi-Gigasample per second throughput.

In one embodiment, the outphasing power amplification system is one of the following: a linear amplification using non-linear components (LINC) power amplification system or an asymmetric multilevel outphasing (AMO) power amplification system.

In one embodiment, the first and second power amplifiers are non-linear power amplifiers.

In one embodiment, the shaping filter includes a zero avoidance filter or a level avoidance filter to avoid input sample amplitudes to the SCS that would fail a convergence criterion.

In one embodiment, the outphasing power amplification system is configured as a linear amplification using non-linear components (LINC) power amplification system; and the shaping filter includes a zero avoidance filter to avoid input sample amplitudes to the SCS around zero.

In one embodiment, the outphasing power amplification system is configured as an asymmetric multilevel outphasing (AMO) power amplification system; and the shaping filter includes a level avoidance filter that avoids several different input sample amplitudes to the SCS.

In accordance with another aspect of the concepts, systems, circuits, and techniques described herein, a compensation circuit for improving linearity in outphasing power amplification systems is provided. The compensation circuit to be placed between a signal component separator (SCS) and first and second power amplifiers of an outphasing power amplification system to adjust phases of first and second phase signals to be input to the first and second power amplifiers. The compensation circuit comprises one or more of the following: a first stage coupled to receive first and second signal components output by the SCS, the first stage including first circuitry to provide a first non-linear transformation to the first signal component and second circuitry to provide a second non-linear transformation to the second signal component, the first signal component including at least a first phase signal and the second signal component including at least a second phase signal; and a second stage coupled to receive output signals of the first stage, the second stage including third circuitry to apply linear time invariant (LTI) transformations to the output signals of the first stage to generate corrected phase signals for the first and second power amplifiers, the LTI transformations having discontinuities at $\pm\pi$, wherein the third circuitry includes at least one complex-valued finite impulse response (FIR) filter to process signals received from the first circuitry of the first stage and at least one complex valued FIR filter to process signals received from the second circuitry of the first stage; wherein the first stage has relatively short memory and the second stage has relatively long memory.

In one embodiment, the first signal component includes the first phase signal and a first amplitude signal and the second signal component includes the second phase signal and a second amplitude signal; the first circuitry includes a tapped delay line having at least one tap to delay an amplitude value of the first amplitude signal and a phase value of the first phase signal to generate at least one previous amplitude value and at least one previous phase value, wherein the first non-linear transformation acts upon the amplitude value of the first amplitude signal, the phase value of the first phase signal, the at least one previous amplitude value of the first amplitude signal, and the at least one previous phase value of the first phase signal; and the second circuitry includes a tapped delay line having at least one tap to delay an amplitude value of the second amplitude signal and a phase value of the second phase signal to generate at least one previous amplitude value and at least one previous phase value, wherein the second non-linear transformation acts upon the amplitude value of the second amplitude signal, the phase value of the second phase signal, the at least one previous amplitude value of the second amplitude signal, and the at least one previous phase value of the second phase signal.

In one embodiment, the third circuitry includes a first upsampler to upsample signals received from the first circuitry of the first stage and a second upsampler to upsample signals received from the second circuitry of the first stage, wherein a first complex-valued FIR filter is coupled to an output of the first upsampler and a second complex-valued FIR filter is coupled to an output of the second upsampler.

In one embodiment, the third circuitry further comprises: a first summer to sum real components output by the first and second complex-valued FIR filters; a first low pass filter to filter an output signal of the first summer; a first downsampler to downsample an output signal of the first low pass filter; a second summer to sum imaginary components output by the first and second complex-valued FIR filters; a second low pass filter to filter an output signal of the second summer; and a second downsampler to downsample an output signal of the second low pass filter.

In one embodiment, the first and second complex-valued FIR filters include short tap filters and the first and second low pass filters include long tap filters.

In one embodiment, the first and second low pass filters include brick wall filters.

In one embodiment, the first circuitry includes circuitry to provide multiple different non-linear transformations to the first signal component and the second circuitry includes circuitry to provide multiple different non-linear transformations to the second signal component, the multiple different non-linear transformations to account for different modes.

In one embodiment, the first circuitry implements the first non-linear transformation as a piecewise linear approximation in two dimensions and the second circuitry implements the second non-linear transformation as a piecewise linear approximation in two dimensions.

In one embodiment, the first circuitry implements the first non-linear transformation using trigonometric polynomials and the second circuitry implements the second non-linear transformation using trigonometric polynomials.

In one embodiment, the compensation circuit is capable of achieving multi-Gigasample per second throughput.

In one embodiment, the compensation circuit can be used with both linear amplification using non-linear components (LINC) power amplification systems and asymmetric multilevel outphasing (AMO) power amplification systems.

BRIEF DESCRIPTION OF THE DRAWINGS

The foregoing features may be more fully understood from the following description of the drawings in which.

DETAILED DESCRIPTION

Figure 1:
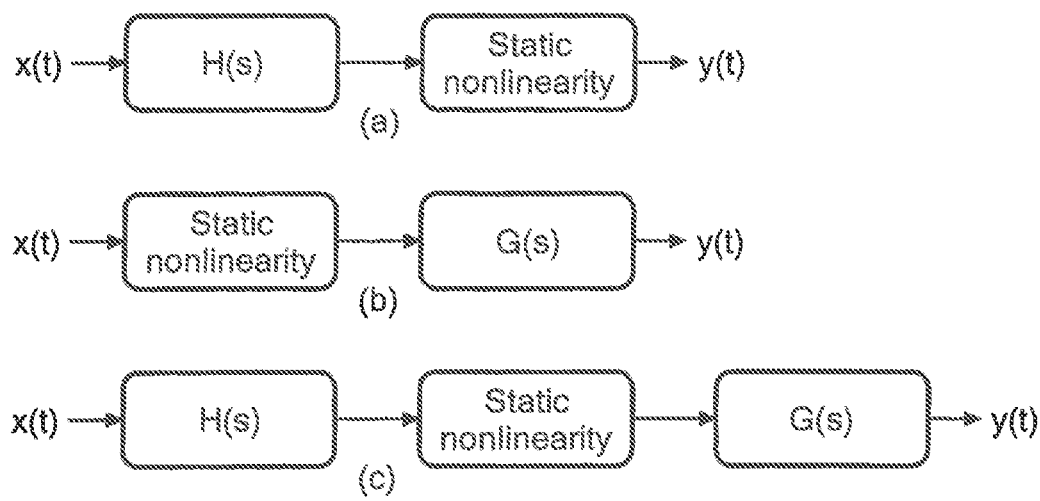
FIGS. 1A-1C are a series of diagrams illustrating three common nonlinear dynamical system structures, namely: (a) the Wiener model, (b) the Hammerstein model, and (c) the Wiener-Hammerstein model.

Referring now to FIG. 1, the basic idea of a digital predistortion (DPD) technique is to create an inverse system of a nonlinear baseband-equivalent system such that when the two systems are concatenated together, the nonlinearities cancel out and the output is a linear version of the input. For narrowband systems, static DPD is often utilized to compensate for memory-less nonlinear behavior, and an LUT is usually enough to implement the DPD. For wideband communication systems, on the other hand, memory effects will typically be present in the resulting nonlinear system model. Therefore, more advanced system modeling techniques are needed to model both the power amplifier (PA) system itself as well as its inverse. Much of the past work utilizes general nonlinear dynamical system structures in the modeling, such as Volterra series, Wiener, Hammerstein, and Wiener-Hammerstein structures, as shown in FIG. 1. Some also have different variations of the above structures to make use of the knowledge of the system. The choice of the models usually depends upon prior knowledge of the system, and in some cases, it has been shown that the Wiener and Hammerstein models have different engineering interpretations that give guidance in selecting between them.

In the description that follows, off-line compensation will first be discussed to demonstrate the feasibility of a compensated solution in the baseband. Then, the resulting data will be analyzed and the structure of the nonlinear system, as well as its inverse, will be shown. Rather than using the more general dynamical system structure, the analysis points to a model structure that allows a decent compensator to be obtained with parameters computed conveniently through least-square fitting.

The two major metrics to evaluate the linearity performance of a PA system include error vector magnitude (EVM) and adjacent-channel-power-ratio (ACPR). The EVM measures the ratio of root-mean-square (RMS) error of a received constellation versus the maximal magnitude of the ideal constellation, as follows:

$$EVM = \frac{Error_{rms}}{S_{max}} \times 100\%. \quad (1)$$

The ACPR characterizes the spectral regrowth through a nonlinear communication chain. The nonlinearity in the system causes spurious spectrum emission to adjacent channels and ACPR measures the interference as the ratio of the average power in the adjacent channels to that in the main channel, as follows:

$$ACPR_{dB} = 10\log_{10}\frac{\text{Average } Power_{adjacent\ channels}}{\text{Average } Power_{main\ channel}}. \quad (2)$$

Figure 2:
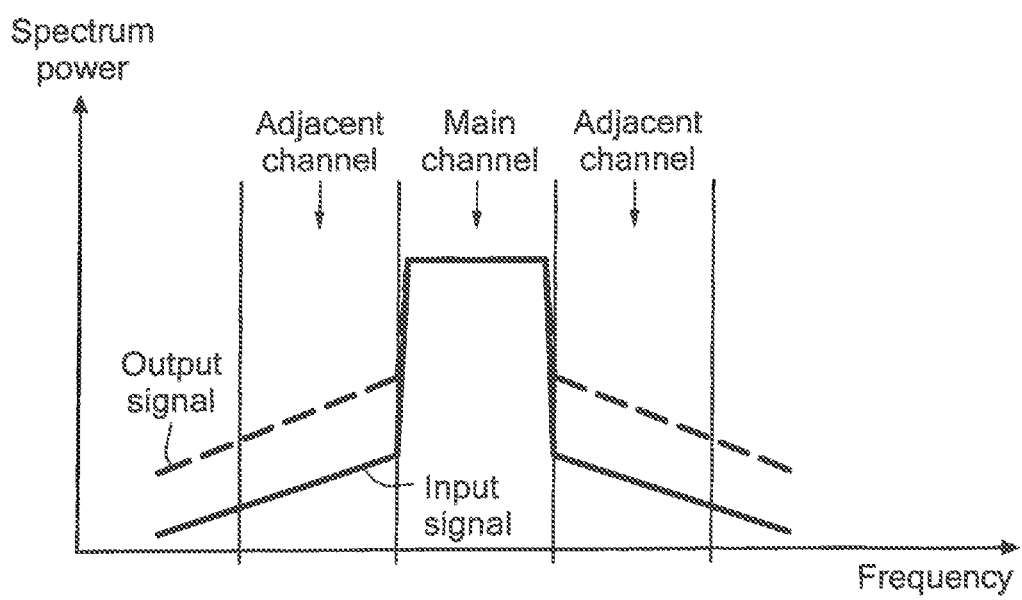
FIG. 2 is a plot of spectrum power vs. frequency illustrating the concept of Adjacent Channel Power Ratio (ACPR)

FIG. 2 is a diagram illustrating the physical meaning of the ACPR definition, where the main and adjacent channels are defined by the particular communication standard being used. In the remainder of the description, these two metrics will be used to evaluate the linearity performance of a PA system both before and after compensation.

Figure 3:
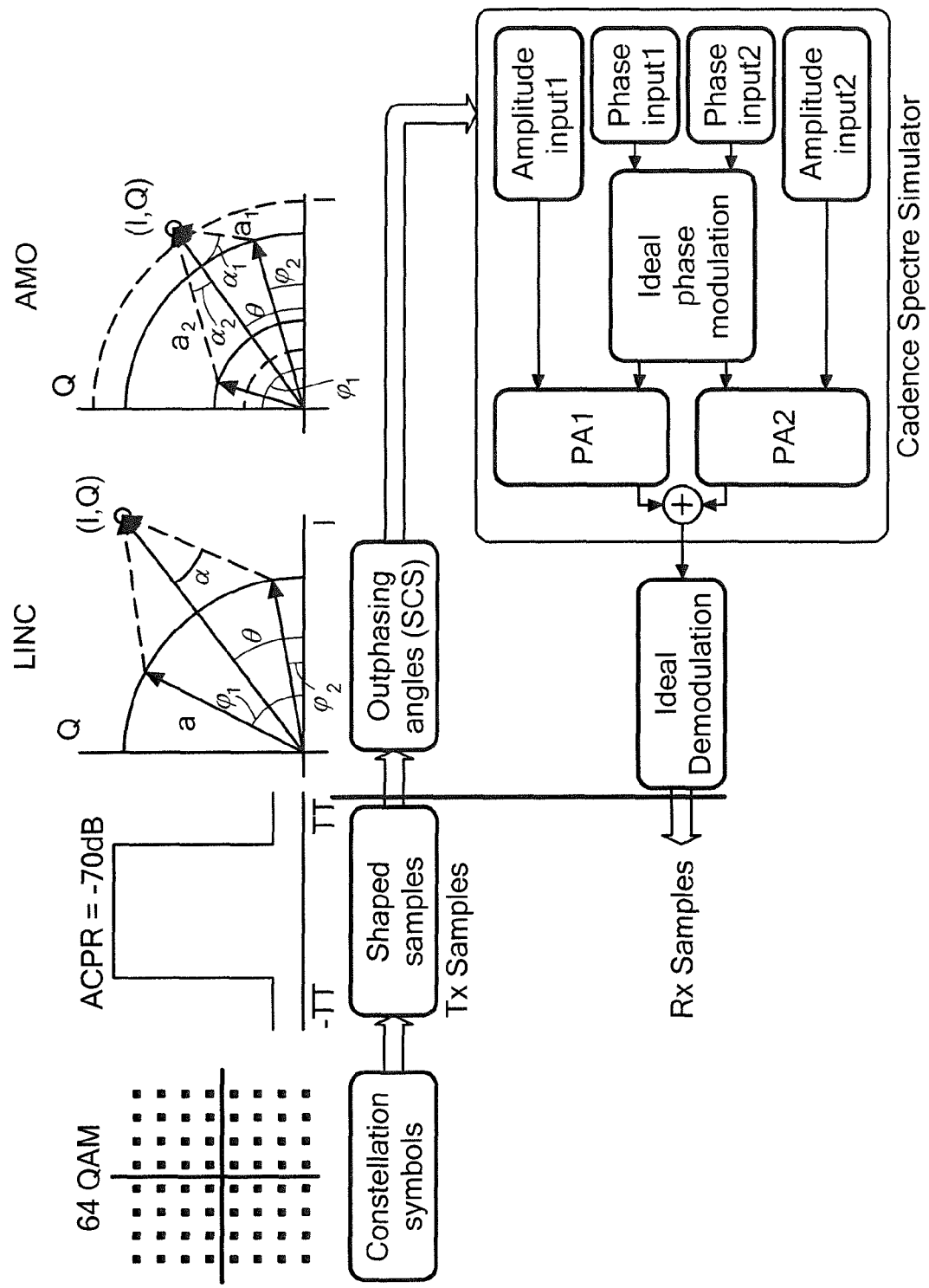
FIG. 3 is a block diagram illustrating an exemplary simulation setup for a LINC/AMO system.

Due to limited access to a real LINC/AMO testing system, simulations were used to analyze effects of digital nonlinear compensation. FIG. 3 is a block diagram illustrating a simulation setup that was used to analyze LINC/AMO system performance under compensation. This framework was used to both investigate the overall system nonlinearity and to test the resulting exemplary compensators. As shown in FIG. 3, random symbols drawn from the 64QAM constellation first pass through a shaping filter, which filters at a higher sampling rate to achieve a shaped spectrum. The shaped samples are then input to a signal component separator (SCS) which decomposes the shaped samples and produces information on the two decomposed vectors (i.e., amplitude and phase signals for an AMO system and phase signals for a LING system). Amplitude and phase commands are then passed to the Spectre simulator as the inputs to the PA system. As illustrated, the PA system includes: an ideal phase modulator, two switching PAs, and an ideal power combiner. The output of the power combiner represents the final transmitted signal. An ideal demodulator is used to obtain the received samples. The operation of the ideal modulator will be discussed below.

In the setup, the two PAs may be simulated with the Spectre simulator. The phase modulator may be realized with a verilog-A model in Spectre. All other blocks may be processed in MATLAB. Focus is placed on the nonlinearity of the two outphasing PAs in this setup. Path mismatch can also be added intentionally in simulation between the phase and amplitude paths. In one scenario, both systems were simulated at a carrier frequency of 45 GHz with 2.5 GHz bandwidth and 2× symbol oversampling rate.

Figure 4A:
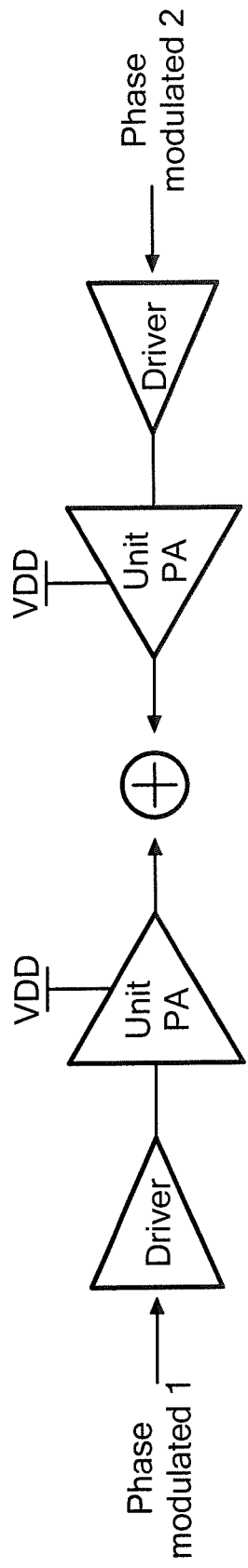
FIGS. 4A and 4B are block diagrams illustrating a Linear Amplification using Nonlinear Components (LINC) power amplifier architecture and an Asymmetric Multilevel Outphasing (AMO) power amplifier architecture, respectively.
Figure 4B:
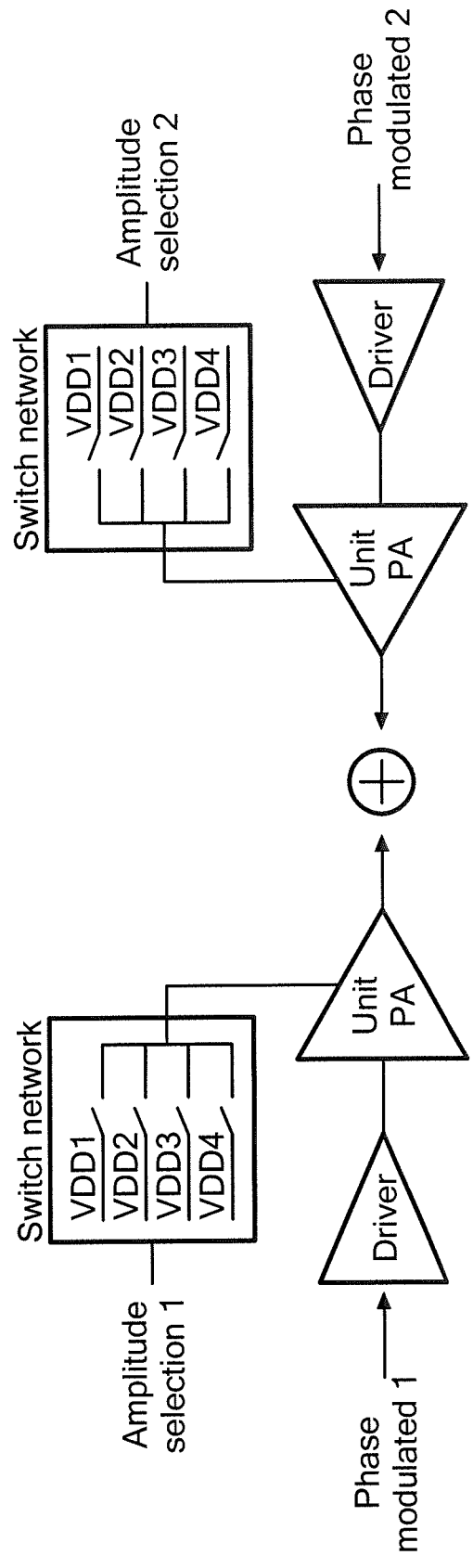
Figure 5:
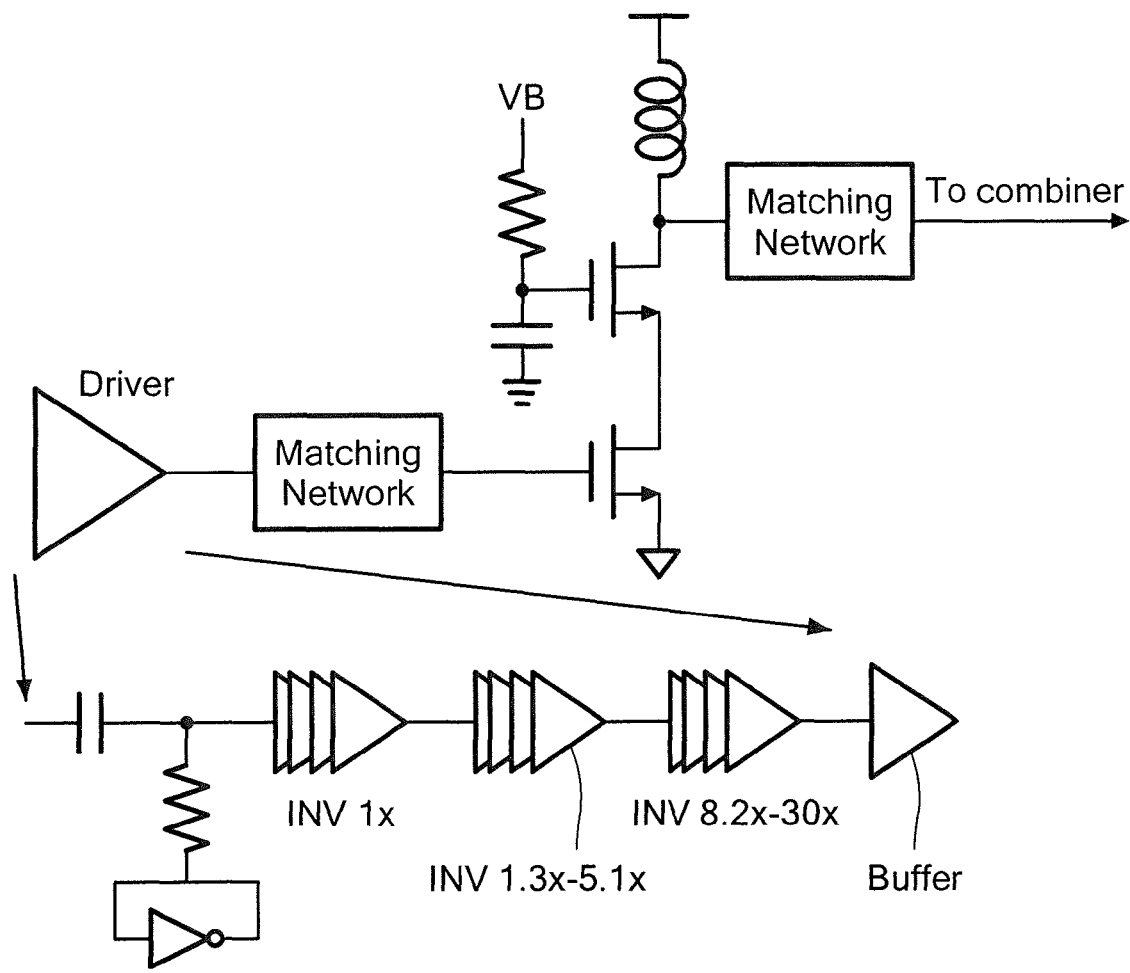
FIG. 5 is a simplified schematic diagram of a cascode class-E power amplifier.

FIGS. 4A and 4B are block diagrams illustrating a LINC system architecture and an AMO system architecture, respectively, that were used for analysis. Both of these architectures share the same driver and unit PA design. The LINC system employs one power supply at 2.2V and the AMO system uses four power supplies at 1.1V, 1.4V, 1.8V, and 2.2V. The unit PA used in the architectures employs a cascode class-E topology, as illustrated in FIG. 5. The unit PA is designed to operate at 45 GHz and deliver watt-level output power. The driver design includes an inverter-based topology to maintain a sufficiently large voltage swing at the class-E PA input, as shown in the expanded portion of FIG. 5. It should be appreciated that, although specific amplifier topologies were used in the analysis, the outphasing power amplification systems and compensator structures of the present disclosure are not limited to these types of amplifier topologies. On the contrary, the power amplification systems and compensator structures of the present disclosure may use any of a wide variety of different amplifier topologies in different implementations.

It is evident from FIG. 5 that a phase modulated signal will be distorted by the driver chain as well as the switching PA. The delay variation in the driver chain, as well as the phase to amplitude conversion, can both introduce nonlinearity into the driver chain. The requirement to pass the millimeter-wave carrier frequency makes it more prone to distortion. Furthermore, the two decomposed phase-modulated signals have much wider bandwidth because of the Cartesian-to-Polar conversion. This leads to an imperfect cancellation when the two signals are combined together. As a result, the received samples will differ from the transmitted ones and stop-band spectrum rises, leading to degradation in both EVM and ACPR.

Figure 6:
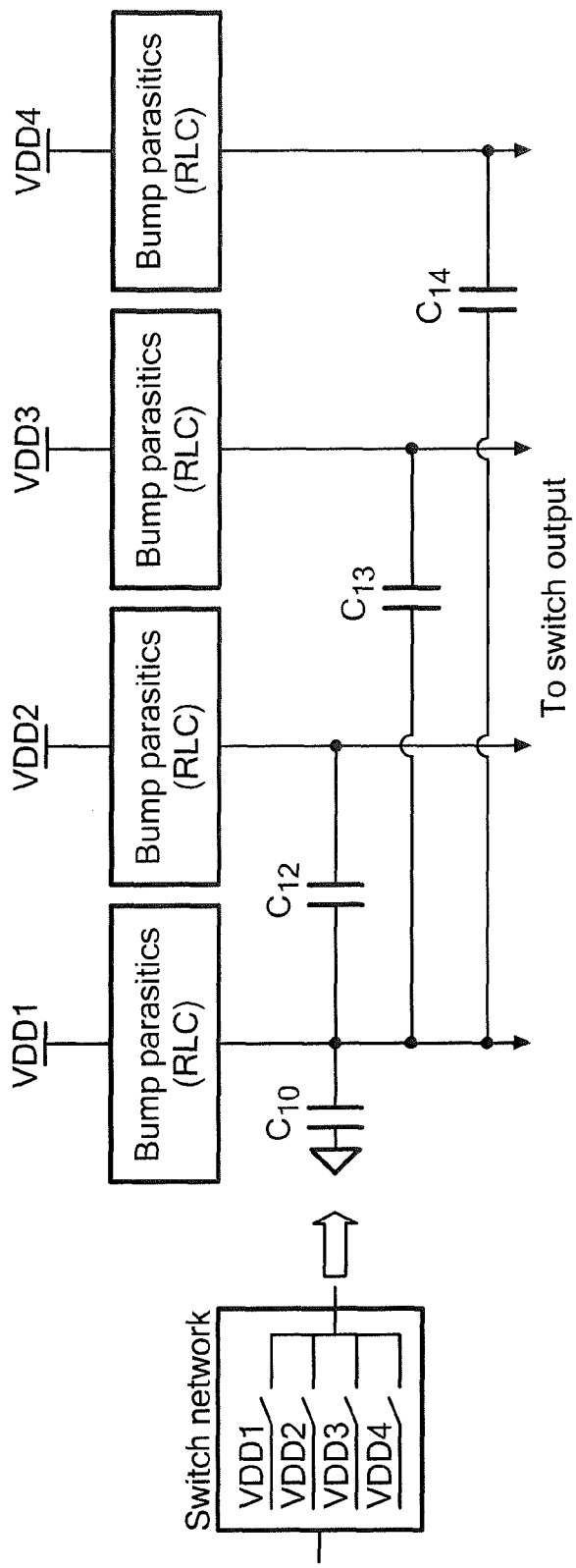
FIGS. 6 and 6A are schematic diagrams illustrating switch network model blocks.
Figure 6A:
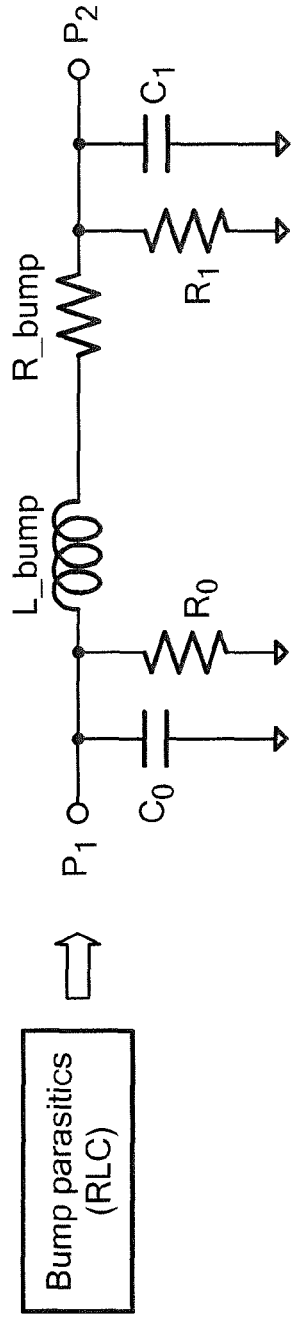

For the AMO architecture, there are a few additional types of nonlinearity. For example, since the AMO system allows the phase-modulated signal to switch among several discrete power supplies, power supply switching becomes another important source of nonlinearity. To model the effect in simulation, one can use a simplified RLC model for the switch network, as shown in FIG. 6. The switch network models parasitics of the bump on board, coupling capacitances from each supply to ground, as well as coupling capacitances among supplies. It also includes the RLC network of the interconnect to account for the parasitics of long wires in supply routing. FIG. 6A shows a model block of the bump parasitics of FIG. 6.

Figure 7:
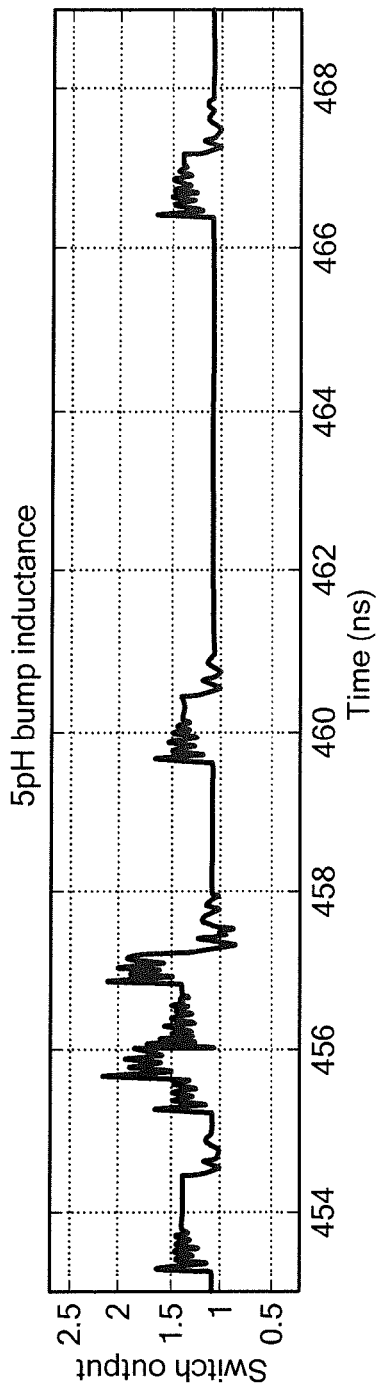
FIGS. 7, 7A, and 7B are a series of plots of switch output vs. time for a switch network using different values of bump inductance.
Figure 7A:
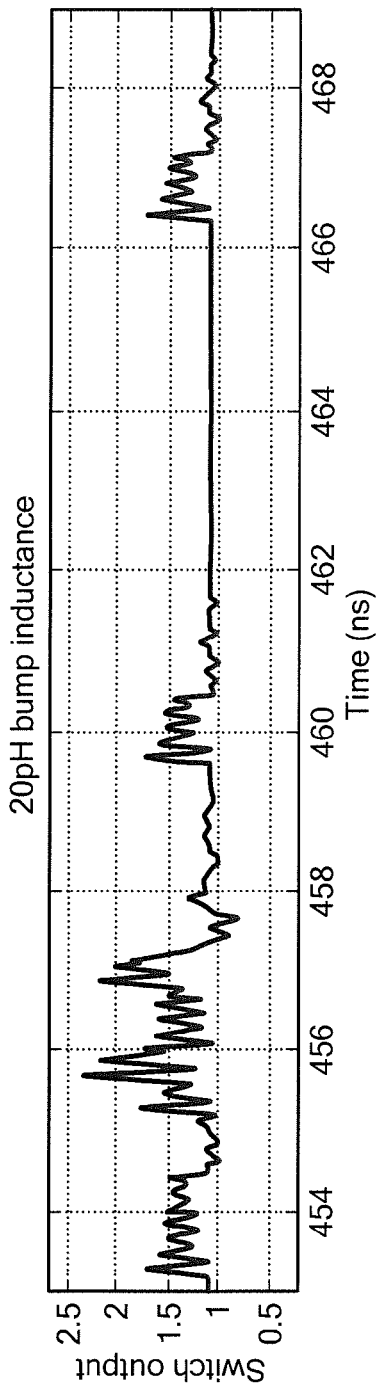
Figure 7B:
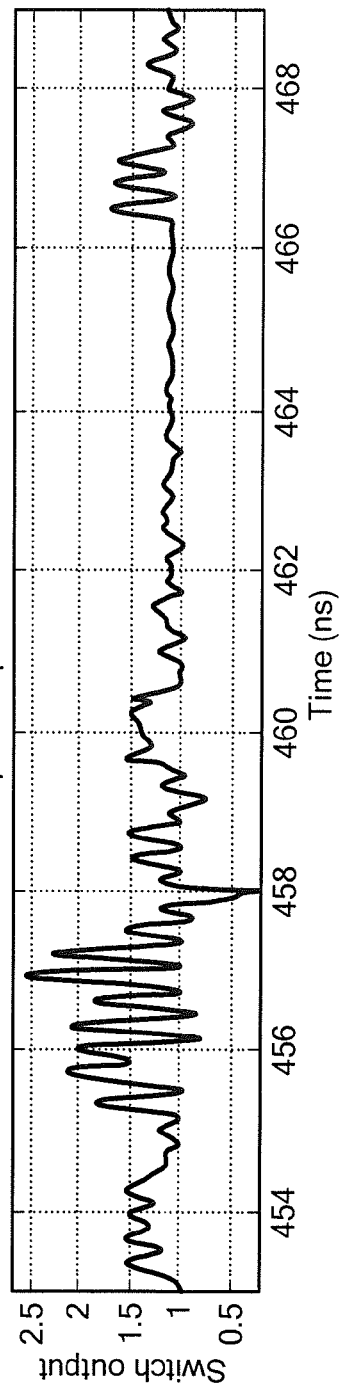

FIGS. 7, 7A, and 7B show the responses of a switch network under different bump inductance values (i.e., 5 pH, 20 pH and 60 pH, respectively). As shown, it takes roughly two samples for a step response to settle in the 5 pH case, five samples in the 20 pH case, and ten samples in the 60 pH case. The resulting effect from the power supply switching is a potential increase in compensator model complexity, in order to take into account of the memory effect.

Another source of nonlinearity associated with the AMO architecture is the path mismatch, referred to as the mismatch between the amplitude and phase paths for the two PAs. Various factors contribute to this nonlinearity, such as mismatch between routing wire lengths, different step-response characteristics between different supply levels, process variations, and thermal effects. In real systems, delay-line tuning may be used to align the amplitude and phase path signals. However, the alignment cannot be made perfect and is limited to the tuning accuracy, as well as the effectiveness of the calibration technique. Therefore, in the AMO nonlinearity compensation simulations, the intentionally added delay between the two paths can be varied to estimate the compensator quality.

Before answering the question of the compensator model's structure, accuracy, and complexity, it is illustrative to explore the improvements that can be gained by tailoring the transmitted sequence to each input sample sequence. Under this more relaxed situation, the compensated sequence that can be produced should outperform any compensator model and hence serves as an upper bound of all possible compensator models. If there is success compensating any given sequence in this off-line fashion, then one is assured that a dynamical compensator model does exist.

Figure 8:
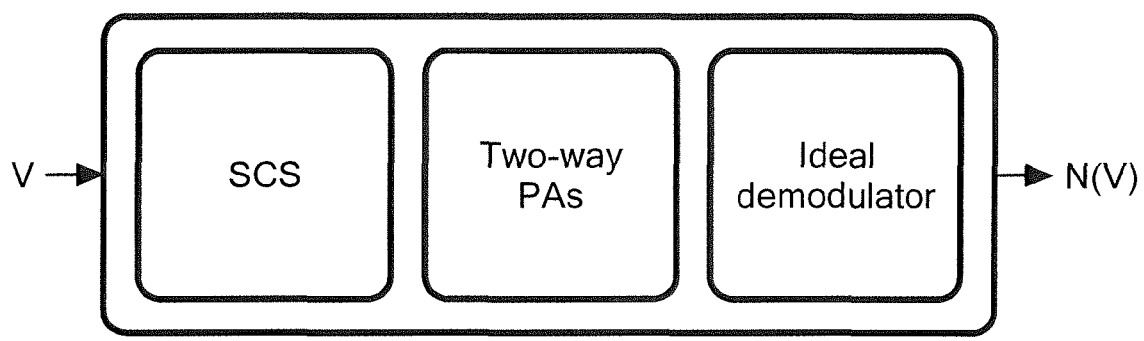
FIG. 8 is a block diagram of an exemplary power amplifier system.

In order to test whether an operative off-line compensator can be achieved, the problem may be abstracted as follows. Define N(x) as an aggregate nonlinear function representing the transformation from transmitted samples to received samples. As shown in FIG. 8, it includes the SCS, LINC/AMO PA system, and the demodulator. Note that FIG. 8 is only a concept illustration of the function N(x), but not indicating the placement of the actual compensator. Then the off-line compensation has a goal of $$N(V_c)=V_i, \qquad (3)$$

where $V_i$ is the desired received samples and $V_c$ is the predistorted sequence (i.e., a solution to the offline compensation question). Now define:

$$\Delta(x)=N(x)-x, \qquad (4)$$

and rewrite equation (3) as:

$$V_c+\Delta(V_c)=V_i. \qquad (5)$$

Since nonlinear function $\Delta(x)$'s form is unknown, many nonlinear system solving techniques are infeasible here. The most direct information that can be obtained on $\Delta(x)$ is its functional value acquired through a simulation with input x. Therefore, one can use the following iterations to solve for the $V_c$ satisfying equation (5):

$$V_c^{k+1}=V_i-\Delta(V_c^k), k=0,1,2,\ldots$$

$$V_c^0=V_i. \qquad (6)$$

For the iteration to converge, function $\Delta(x)$ has to satisfy the following criterion:

$$\|\Delta(x_1)-(x_2)\|\leq\theta\|x_1-x_2\|, \qquad (7)$$

$$\theta<1. \qquad (8)$$

In other words, in order for the iterations to converge, function $\Delta(x)$ has to have a Lipschitz constant less than 1. Although there seems little that can be done to change the function $\Delta(x)$ once the design is fixed, one can design the compensator input sample sequence to avoid the regions of $\Delta(x)$ that would fail the convergence criterion. Such regions do exist because of the discontinuous SCS functions in both LINC and AMO architectures. Take the LINC architecture, for example. Assume $v \in \mathbb{C}$ is the input sample of SCS, $v_1$, $v_2 \in \mathbb{C}$ are the two decomposed samples, and a is the amplitude of the decomposed samples, one has:

$$\begin{cases} v = v_1 + v_2, \\ |v_1| = |v_2| = a. \end{cases} \qquad (9)$$

Solve for $v_1$, $v_2$, to get:

$$v_{1,2} = F(v) = \frac{v}{2} \pm j \cdot \frac{v}{|v|} \sqrt{a^2 - \frac{|v|^2}{4}}. \qquad (10)$$

Calculate the Frobenius norm of the Jacobian of function F(v), to obtain:

$$\|Jacobian_{v_1}\|_F = \frac{2a^2}{|v|\sqrt{4a^2 - |v|^2}}. \qquad (11)$$

Figure 9:
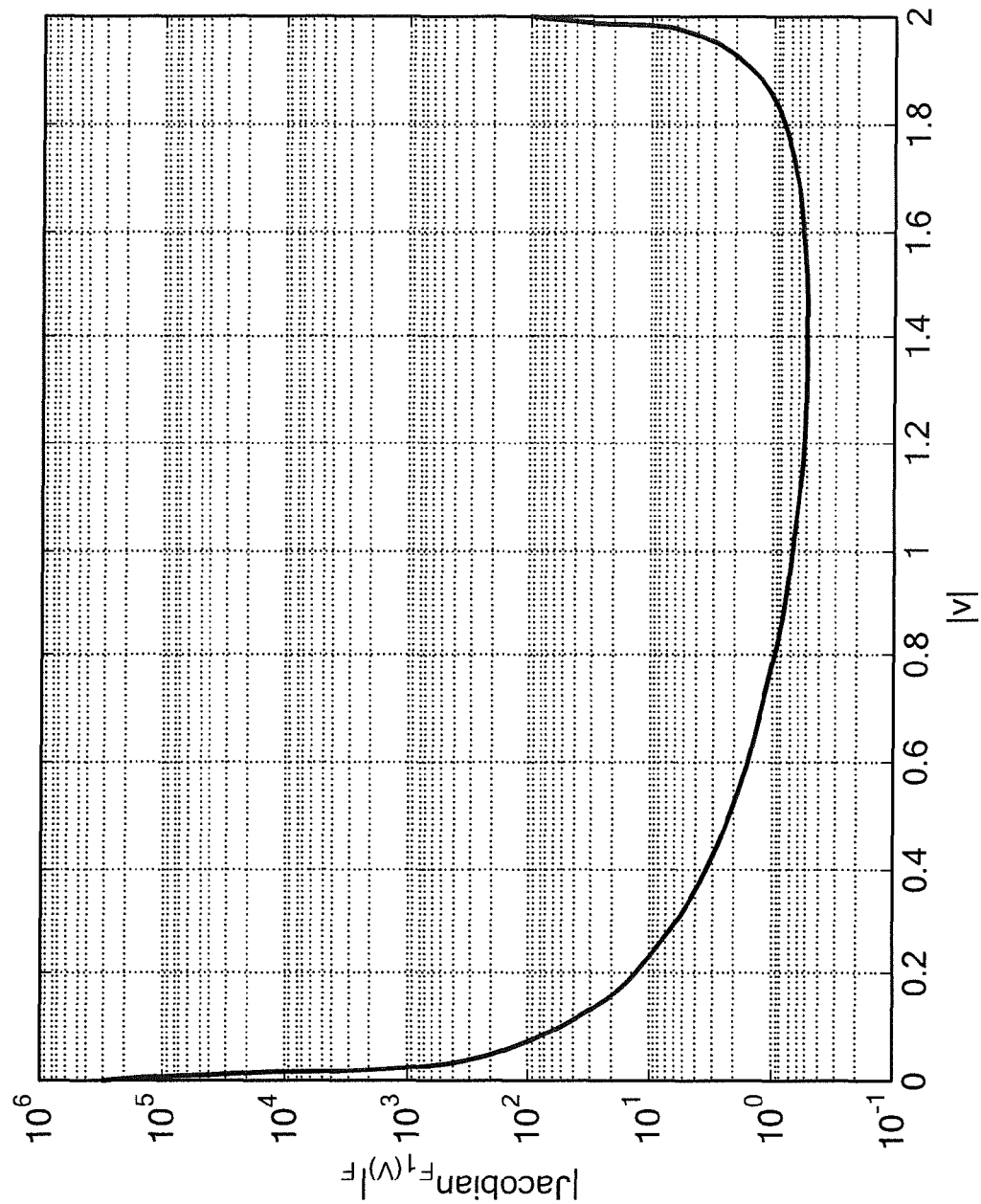
FIG. 9 is a plot of the Frobenius norm of the Jacobian of the function $v \rightarrow v_1$. $a=1$.

FIG. 9 plots the function in Equation (11) with a=1. The Jacobian approaches infinity when the input sample amplitude closes to zero. Therefore, avoiding the region close to zero should help speed up the conversion of the iteration of Equation (6). For the AMO architecture, a similar conclusion is achieved. From the equations:

$$\begin{cases} v = v_1 + v_2, \\ |v_1| = a_1, \\ |v_2| = a_2, \end{cases} \quad (12)$$

we have:

$$v_{1,2} = G_{1,2}(v) = \frac{v}{2}\gamma \pm j \cdot \frac{v}{|v|}\sqrt{a_1^2 - \frac{|v|^2 \gamma^2}{4}}, \quad (13)$$

where $$\gamma = 1 + \frac{a_1^2 - a_2^2}{|v|^2}, \quad (14)$$

where $a_1$, $a_2$ are the two amplitude levels of the decomposed signals. The Frobenius norm of the Jacobian of the function $G_1(v)$ is shown in Equation (15) and is plotted in FIG. 10.

$$\|\text{Jacobian}(G_1(v))\|_F = \frac{2a_1 a_2}{\sqrt{[(a_1+a_2)^2 - |v|^2][|v|^2 - (a_1-a_2)^2]}}. \quad (15)$$

Figure 10:
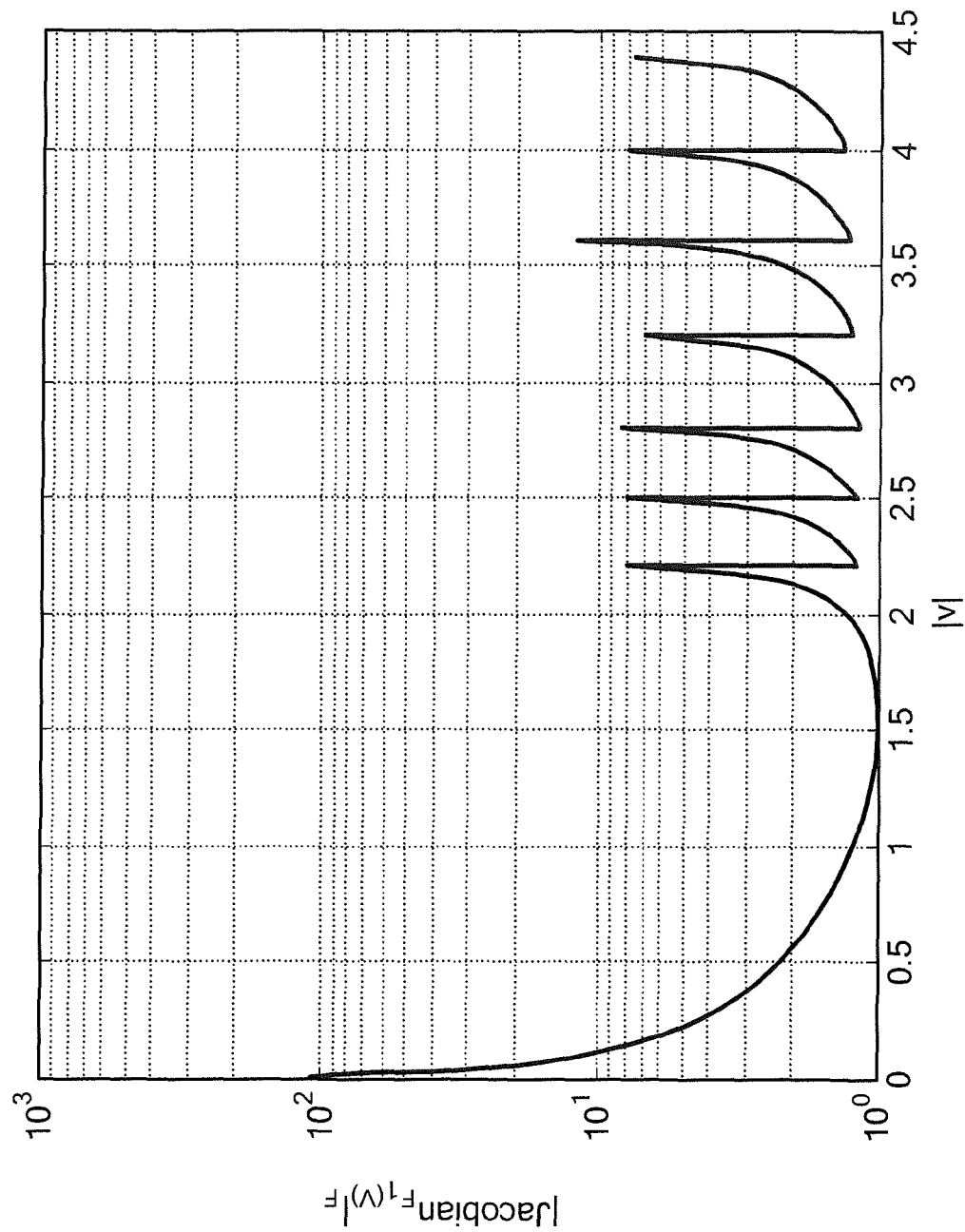
FIG. 10 is a plot of a Frobenius norm of the Jacobian of the function $G_1(v)$. $a_1, a_2 \epsilon [1.1, 1.4, 1.8, 2.2]$.

Compared to the LINC architecture, the Jacobian for the AMO approaches infinity in several more regions where the amplitudes of the decomposed signals switch to different levels. As shown in FIG. 10, besides the region $|v| \to 0$, there are levels of $|v| \to 2.2, 2.5, 2.8, 3.2, 3.6, 4,$ and $4.4$ which also should be avoided. To achieve a sample sequence avoiding all those regions and levels, a special filter is needed to replace the normal shaping filter.

Since one possible aim is to lower the ACPR under −40 dB, the iterations have to be carried out as precisely as possible. Besides setting the simulator accuracy level to be conservative, it may also be important to use an accurate ideal demodulator as shown in FIG. 8. This "ideal demodulator" takes the frequency response from the band of interest around the carrier frequency and solves for the exact frequency response of the input. In this way, one is able to isolate the baseband-equivalent system without introducing extra effects from non-ideal down-converting and low-pass filtering. The iteration procedure can be then carried out with greater accuracy. The mathematics for the ideal demodulator can be derived as follows. Define the input sample sequence as v[n]. After modulation, the continuous-time signal y(t) is:

$$y(t) = 2Re[v(t) \cdot e^{j\omega_c t}],$$

$$v(t) = \text{Zoh}(v[n]), \quad (16)$$

where Zoh(t) is the zero-order sample-and-hold function, $\omega_c$ is the carrier frequency in radians, and the Fourier Transform of v(t) can be written as:

$$V(j\omega) = \frac{1 - e^{-j\omega t}}{1 - j\omega} V(e^{j\omega T}), \quad (17)$$

where T is the sample duration, and $V(e^{j\Omega})$ is defined as the discrete time Fourier Transform of v[n], and the Fourier Transform of y(t) is:

$$Y(j\omega) = \frac{1 - e^{-j\omega T}}{j(\omega - \omega_c)} V(e^{j\omega T}) + \frac{1 - e^{-j\omega T}}{j(\omega + \omega_c)} \overline{V(e^{-j\omega T})}. \quad (18)$$

Replacing variable $\omega$ with $\hat{\omega} + \omega_c$, and assuming that there is an integer number of carrier periods in one sample, namely $\omega_c T = 2\pi k$, $k \in \mathbb{Z}$, results in:

$$Y(j(\hat{\omega} + \omega_c)) = \frac{1 - e^{-j\hat{\omega}T}}{j\hat{\omega}} V(e^{j\hat{\omega}T}) + \frac{1 - e^{-j\hat{\omega}}T}{j(\hat{\omega} + 2\omega_c)} \overline{V(e^{-j\hat{\omega}T})} = \quad (19)$$

$$\frac{1 - e^{-j\hat{\omega}T}}{j\hat{\omega}} \left( V(e^{j\hat{\omega}T}) + \frac{\hat{\omega}}{\hat{\omega} + 2\omega_c} \overline{V(e^{-j\hat{\omega}T})} \right).$$

From (19), the following set of equations is obtained:

$$\begin{cases} V(e^{j\hat{\omega}T}) + \frac{\hat{\omega}}{\hat{\omega}+2\omega_c} \overline{V(e^{-j\hat{\omega}T})} = \frac{j\hat{\omega}}{1 - e^{-j\hat{\omega}T}} Y(j(\hat{\omega}+\omega_c)) \\ \frac{-\hat{\omega}}{-\hat{\omega}+2\omega_c} V(e^{j\hat{\omega}T}) + \overline{V(e^{-j\hat{\omega}T})} = \frac{j\hat{\omega}}{1 - e^{-j\hat{\omega}T}} \overline{Y(j(-\hat{\omega}+\omega_c))} \end{cases}. \quad (20)$$

Since $Y(j(\hat{\omega}+\omega_c))$ and $Y(j(-\hat{\omega}+\omega_c))$ are known from the Fourier Transform of the simulation output, the value $V(e^{j\hat{\omega}T})$ can be calculated (demodulated) as the solution of these linear equations with two variables, $$V(e^{j\hat{\omega}T}) = \frac{A \cdot B \cdot \overline{Y(j(\omega_c - \hat{\omega}))} - B \cdot Y(j(\hat{\omega} + \omega_c))}{A \cdot C - 1}, \quad (21)$$

where $$A = \frac{\hat{\omega}}{\hat{\omega} + 2\omega_c},$$

$$B = \frac{j\hat{\omega}}{1 - e^{-j\hat{\omega}T}},$$

$$C = \frac{-\hat{\omega}}{-\hat{\omega} + 2\omega_c}.$$

Since finely oversampled discrete signals Y are used in simulation, Equation (20) should be implemented with its Discrete Fourier Transform (DFT). The same derivation principle follows, with all signals expressed in their DFT. Starting with Equation (16), the signal v(t) corresponding to the discrete signal's Fourier Transform may be expressed as:

$$V(e^{j\Omega}) = \frac{1 - e^{-j\Omega M}}{1 - e^{-j\Omega}}, \quad (22)$$

where M is the number of time discretization points in one sample duration. The discrete Fourier Transform for the discretized y(t) can then be expressed as:

$$Y(e^{j\Omega}) = \frac{1 - e^{-j\Omega M}}{1 - e^{-j(\Omega - \Omega_c)}} V(e^{j\Omega M}) + \frac{1 - e^{-j\Omega M}}{1 - e^{-j(\Omega + \Omega_c)}} \overline{V(e^{-j\Omega M})}, \quad (23)$$

where $$\Omega_c = \omega_c \frac{T}{M}.$$

Similarly, replacing variable $\Omega$ with $\hat{\Omega}+\Omega_c$, the following linear equations with two unknowns can be obtained:

$$\begin{cases} V(e^{j\hat{\Omega}}) + \frac{1-e^{-j\hat{\Omega}}}{1-e^{-j(\hat{\Omega}+2\Omega_c)}} \overline{V(e^{-j\hat{\Omega}})} = \frac{1-e^{-j\hat{\Omega}}}{1-e^{-j\hat{\Omega}M}} Y(e^{j(\hat{\Omega}+\Omega_c)}) \\ \frac{1-e^{-j\hat{\Omega}}}{1-e^{-j(\hat{\Omega}-2\Omega_c)}} V(e^{j\hat{\Omega}}) + \overline{V(e^{-j\hat{\Omega}})} = \frac{1-e^{-j\hat{\Omega}}}{1-e^{-j\hat{\Omega}M}} \overline{Y(e^{j(-\hat{\Omega}+\Omega_c)})} \end{cases} \quad (24)$$

and lastly the unknown $V(e^{j\hat{\Omega}})$ is solved for and the following expression results:

$$V(e^{j\hat{\Omega}}) = \frac{\frac{1-e^{-j\hat{\Omega}M}}{1-e^{-j\hat{\Omega}}} \cdot Y_0 - \frac{1-e^{-j\hat{\Omega}M}}{1-e^{-j(\hat{\Omega}+2\Omega_c)}} \cdot Y_1}{\left(\frac{1-e^{-j\hat{\Omega}M}}{1-e^{-j\hat{\Omega}}}\right)^2 - \frac{(1-e^{-j\hat{\Omega}M})^2}{(1-e^{-j(\hat{\Omega}+2\Omega_c)})(1-e^{-j(\hat{\Omega}-2\Omega_c)})}}, \quad (25)$$

where:

$$Y_0 = Y(e^{j(\Omega_c+\hat{\Omega})}), Y_1 = \overline{Y(e^{j(\Omega_c-\hat{\Omega})})} \quad (26)$$

Finally, the received samples are the inverse Fourier Transform of $V(e^{j\Omega})$ and the numerics on samples are done through IFFT:

$$v[n]=\text{Inverse Fourier Transform}(V(e^{j\Omega})). \quad (27)$$

To summarize, in the demodulation process, the output signal is first interpolated and re-sampled. Equations (25) and (27) are then used to obtain the received samples. The traditional way of demodulation is to down-convert the simulation output from carrier frequency to baseband and filter out the undesired frequency band. The difference between the two approaches can be traced back to Equation (19). The traditional approach assumes $Y(j(\hat{\omega}+\omega_c))=V(e^{j\hat{\omega}T})$ and ignores the term $$\frac{\hat{\omega}}{\hat{\omega}+2\omega_c} \overline{V(e^{-j\hat{\omega}T})}$$

as well as the effect from sample-and-hold. For general demodulation purposes, the error it introduces may be tolerable. However, in our situation, the error may hinder the iteration convergence. Therefore, the more accurate demodulation approach described above can be implemented using the above equations.

Once the received samples are successfully obtained, the value of $\Delta(V_c^k)$ at the $k^{th}$ iteration may be calculated by taking the difference between the transmitted samples and the received samples, as in Equation (5). Then, the $k^{th}$ iteration loop (Equation (6)) completes and the next iteration is initiated.

To test the effectiveness of the iteration scheme, the iterations of Equation (6) were performed for both LINC and AMO systems with a unit PA design and the simulation setup of FIG. 4 was used. Both the LINC and AMO systems operate with carrier frequencies at 45 GHz and input sample bandwidth at 2.5 GHz. The power supply level of the LING system is at 2.2V and the AMO system uses four power supplies switching among 1.1V, 1.4V, 1.8V and 2.2V. All input symbols are drawn randomly from the 64-QAM constellation and shaped to input samples with an oversampling rate of 2. Zero-avoidance and level-avoidance filters were used to achieve the input sequences avoiding those regions.

Table 1 shows the ACPR and EVM performances of the LINC system with a 1024-sample input sequence, which is generated randomly and shaped in spectrum by a real-time zero-avoidance filter. In the table, $\theta_{1,2}$ and $\theta$ represent the Lipschitz constants of a single-way PA and the overall LINC system. As indicated in Equation (8), these constants determine the convergence rate of the iteration. The EVM and ACPR columns in the table show the converging performances through 3 iterations. The steady yet slowly decreasing improvements in the two metrics are confirmed by the last column $\theta$. It is seen that although the Lipschitz constant of each PA stays away from 1 through iterations, the Lipschitz constant of the overall LINC system approaches 1 as iteration goes on hence the improvements diminish along the way. The main reason for the diminishing gain is that the nonlinear effect of the overall LINC system not only depends on the nonlinearity from each of the PAs, but also the way the input sample is decomposed. After the two PA channels, the decomposed signals can no longer perfectly sum up to the original input, and the effective nonlinear effect differs from that of each PA. Therefore, $\theta$ shows a different trend than $\theta_1$ and $\theta_2$.

TABLE 1

| Iteration | EVM (%) | ACPR (dB) | $\theta_1$ | $\theta_2$ | $\theta$ |
|---|---|---|---|---|---|
| 0 | 4.5 | −30.6 | NA | NA | NA |
| 1 | 1.7 | −37.6 | 0.145 | 0.174 | 0.289 |
| 2 | 1.1 | −42.4 | 0.192 | 0.244 | 0.435 |
| 3 | 1.0 | −44.0 | 0.191 | 0.228 | 0.701 |

Figure 11:
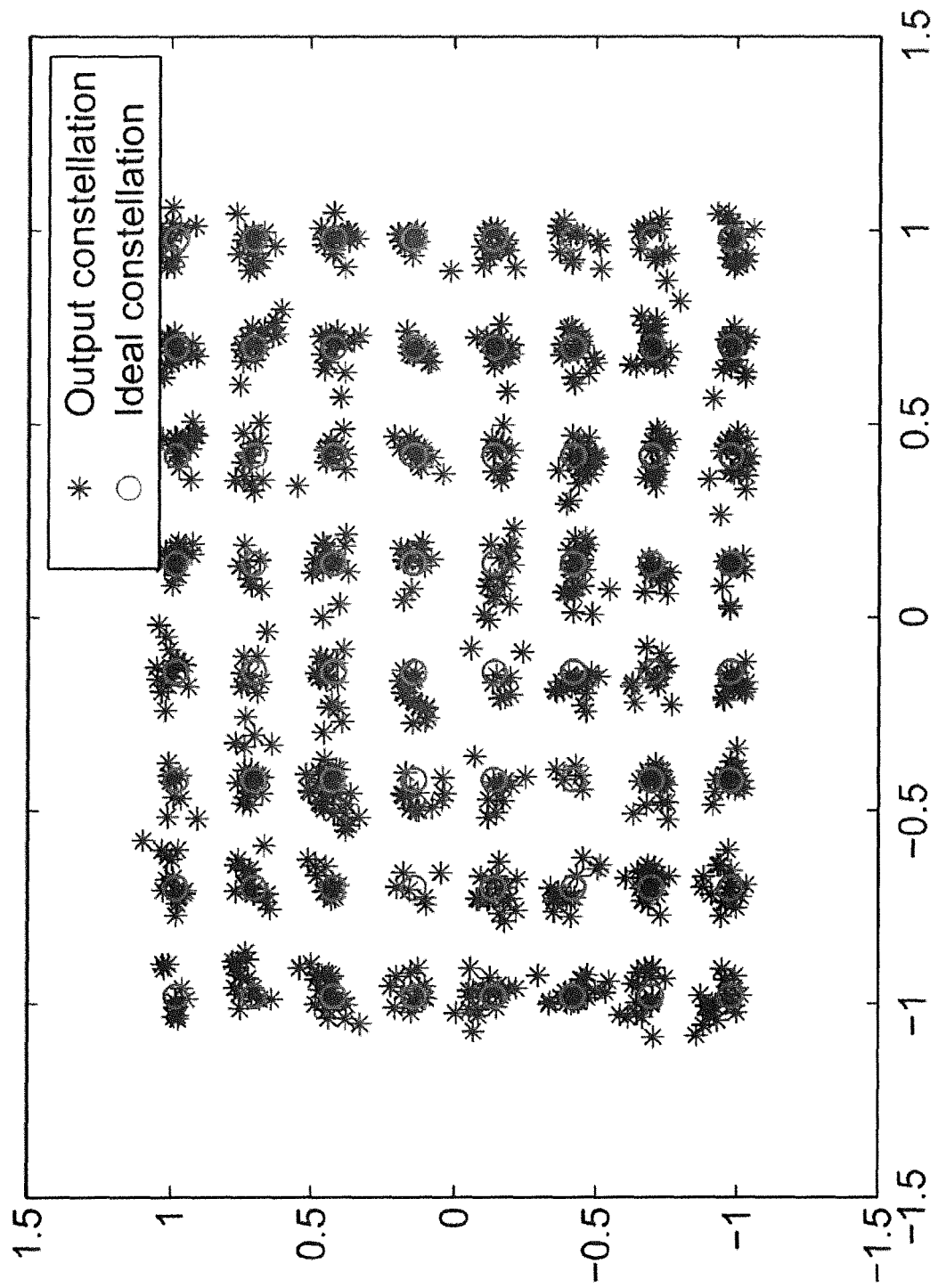
FIG. 11 is a plot of error vector magnitude (EVM) of an uncompensated LINC power amplifier system.
Figure 12:
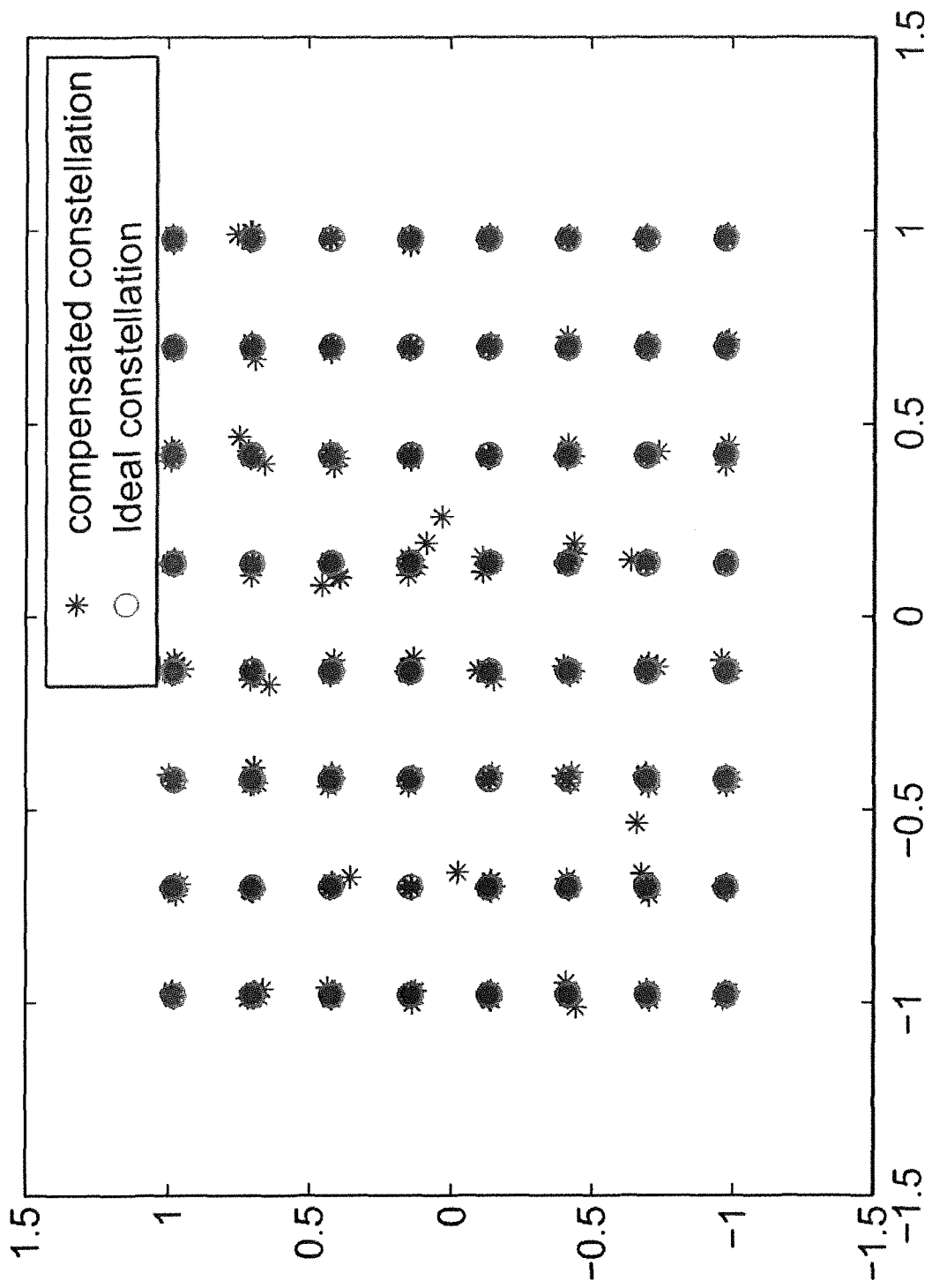
FIG. 12 is a plot of EVM of a compensated LING power amplifier system with a real-time zero-avoidance input sequence in accordance with an embodiment.
Figure 13:
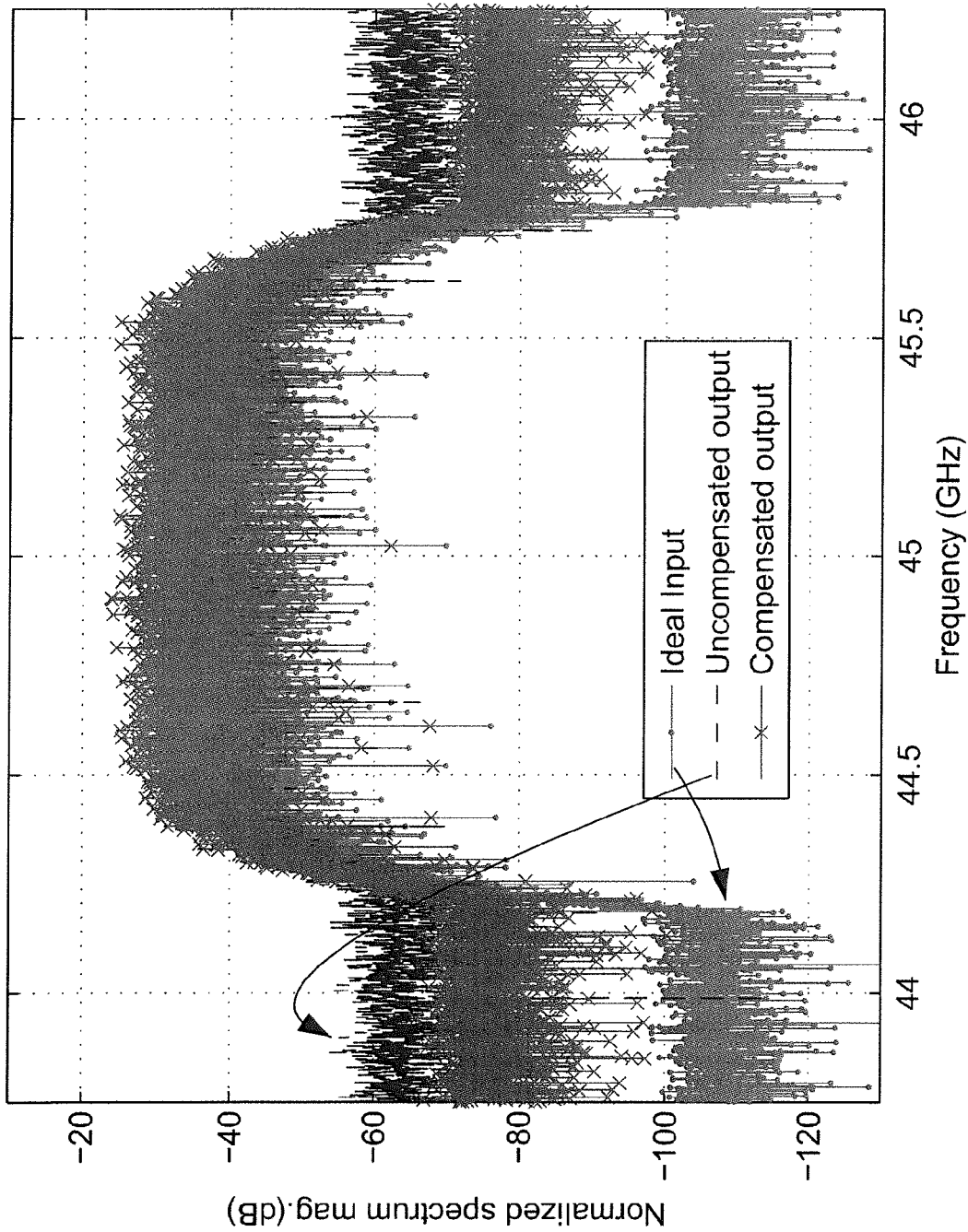
FIG. 13 is a plot of input and output ACPR of a LINC power amplifier system, with a real-time zero-avoidance input sequence in accordance with an embodiment.

FIGS. 11 and 12 show the EVM performances before and after the off-line compensation, both compared with an ideal 64-QAM constellation. The two EVM figures correspond to an improved EVM performance from 4.5% to 1.0%. FIG. 13 shows the ACPR performance improvement before and after compensation, from −30.6 dB to −44.0 dB.

To verify the need for the zero-avoidance filter, off-line iterations can be performed with an input sequence without the zero-avoidance property and this can be compared with the previous zero-avoidance input sequence. Such comparisons were carried out on two design examples. One of the examples is the design used to produce the results so far. The other example is a PA design with the same architecture but all transistors' bodies are properly tied to ground or supply. The body-tied PA works at 22.5 GHz and has a sample bandwidth of 1.25 GigaSamples/s. The comparison results are shown in the Table 2.

One can observe that for both designs, zero-avoidance sequences help iterations converge better. For a body-tied design, the iteration cannot converge at all without the zero-avoidance property in input sequence, while it converges nicely with such property. From these comparisons, the effectiveness of the zero-avoidance property in achieving a better converged compensation sequence is shown. Techniques have been developed to achieve a partial zero-avoidance property, including at least one real-time technique. A zero-avoidance sequence can also be obtained using offline optimization techniques with better zero-avoidance.

Table 3 shows the offline iteration result comparison between using a real-time and an offline filter. For the first data set of the body-tied PA design, the offline filter outperforms the real-time filter with around 4 dB better performance in ACPR and slightly better EVM. For the second data set, the two filters lead to roughly the same performance. Therefore, it is possible to realize the offline technique with a real-time implementation strategy.

TABLE 2

ACPR and EVM performance comparisons between using input sequence with and without zero-avoidance property for LINC systems. The zero-avoidance filter has a real-time implementation.

|  | Floating-body PA | | Body-tied PA | |
| --- | --- | --- | --- | --- |
|  | Zero-avoidance | No zero-avoidance | Zero-avoidance | No zero-avoidance |
| ACPR (dB) | −30.6 → −44 | −30.1 → −39.6 | −41.3 → −56.4 | −44 → N/A |
| EVM (%) | 4.5 → 1.0 | 4.2 → 1.7 | 2.6 → 0.15 | 0.9 → N/A |

TABLE 3

Comparison of offline iteration results with real-time and offline zero-avoidance filters.

|  | Body-tied PA data set 1 | | Body-tied PA data set 2 | |
| --- | --- | --- | --- | --- |
|  | Real-time | Offline | Real-time | Offline |
| ACPR (dB) | −37.3 → −47.7 | −37.7 → −51.2 | −41.3 → −56.4 | −38 → −56.5 |
| EVM (%) | 2.0 → 0.43 | 1.7 → 0.40 | 1.3 → 0.15 | 1.65 → 0.17 |

For the AMO system, several scenarios were investigated with different parasitic values and path delays. These experiments show different levels of off-line compensation ability, and hence serve as a guideline for circuit and board designers who need compensators for their systems. For instance, the stringent path timing-matching specification for the delay-line design may be relaxed a little bit thanks to the confirmation that a digital compensator is capable of compensating the path mismatch within a certain range. Designers would also know the range of the switch ringing that could be handled by a compensator and design the circuit boards accordingly.

Table 4 shows the iteration results for different bump inductance values, as shown in the schematic of FIG. 6. The input sequences are generated from an offline level-avoidance filter. In both the 5 pH and 20 pH cases, the iterations converge nicely and result in improved EVMs to around 0.7% and ACPRs around −44 dB. In the 60 pH case, the ringing effect from the bump inductance is so large that the iteration stops converging even in the second iteration, and therefore results in a smaller performance improvement: 2.6% EVM and −34 dB ACPR.

Figure 14:
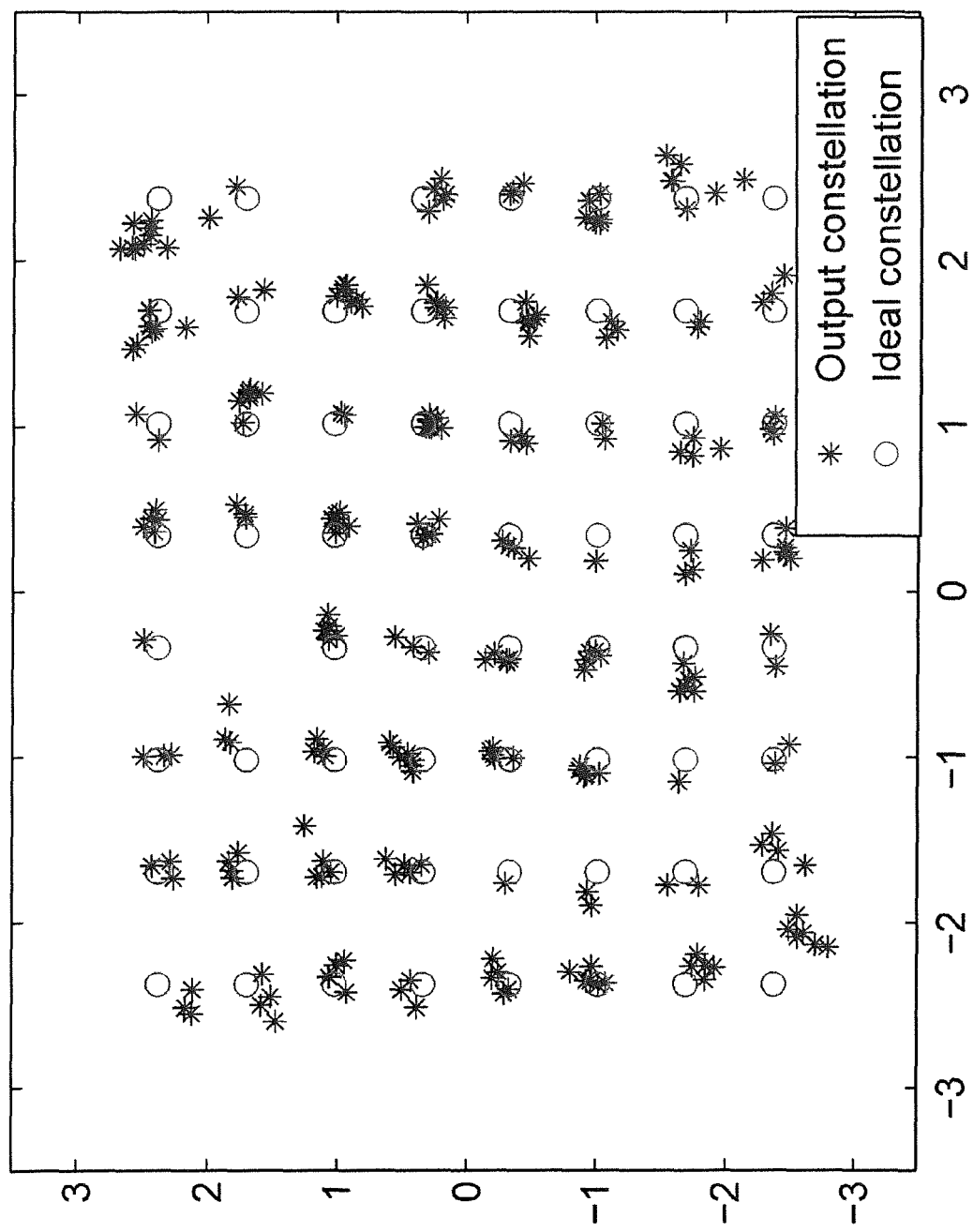
FIG. 14 is a plot of EVM of an uncompensated AMO system with $L_{bump}=20$ pH.
Figure 15:
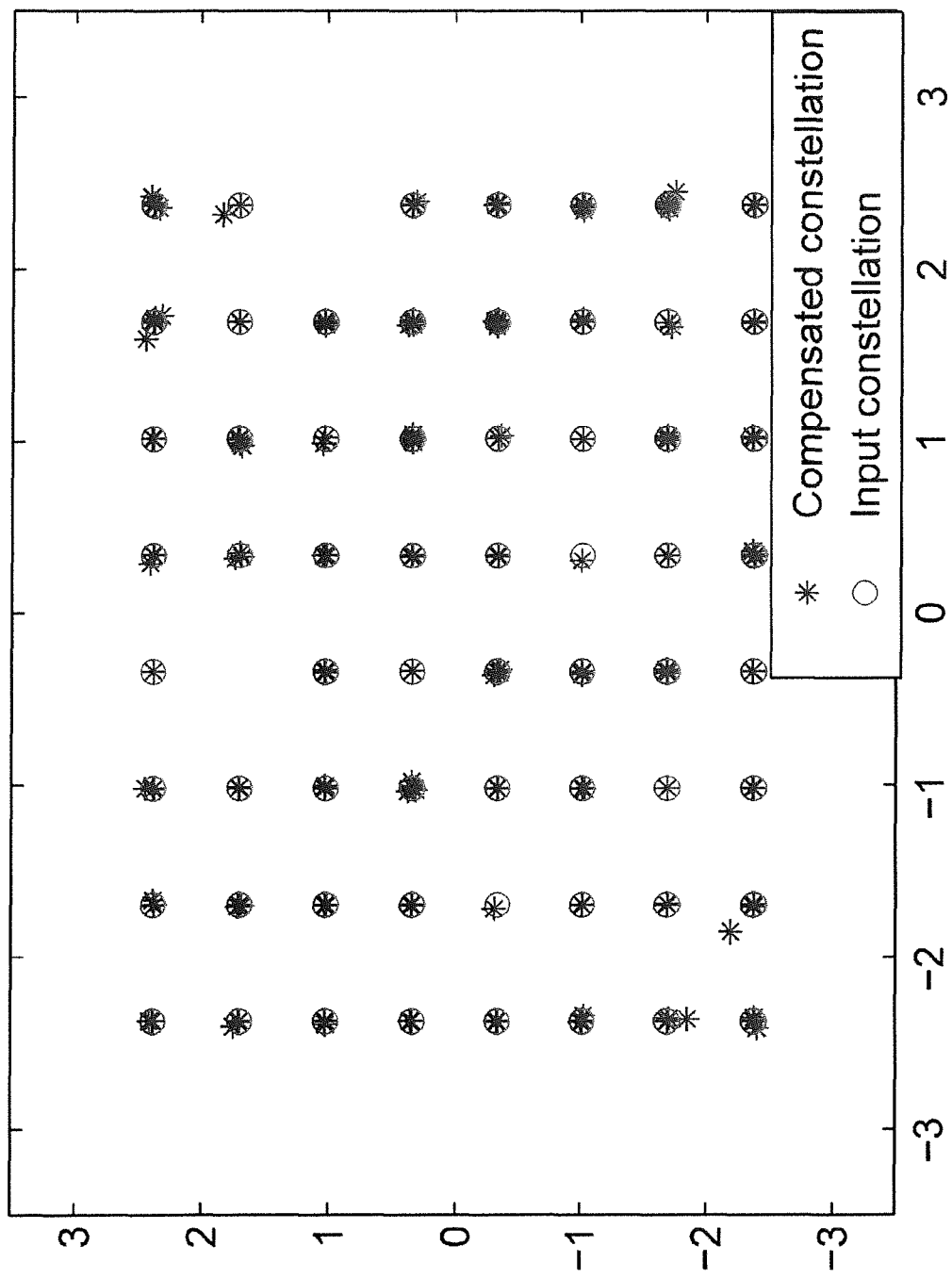
FIG. 15 is a plot of EVM of a compensated AMO system with $L_{bump}=20$ pH where the input sequence is generated from an offline level-avoidance filter in accordance with an embodiment.
Figure 16:
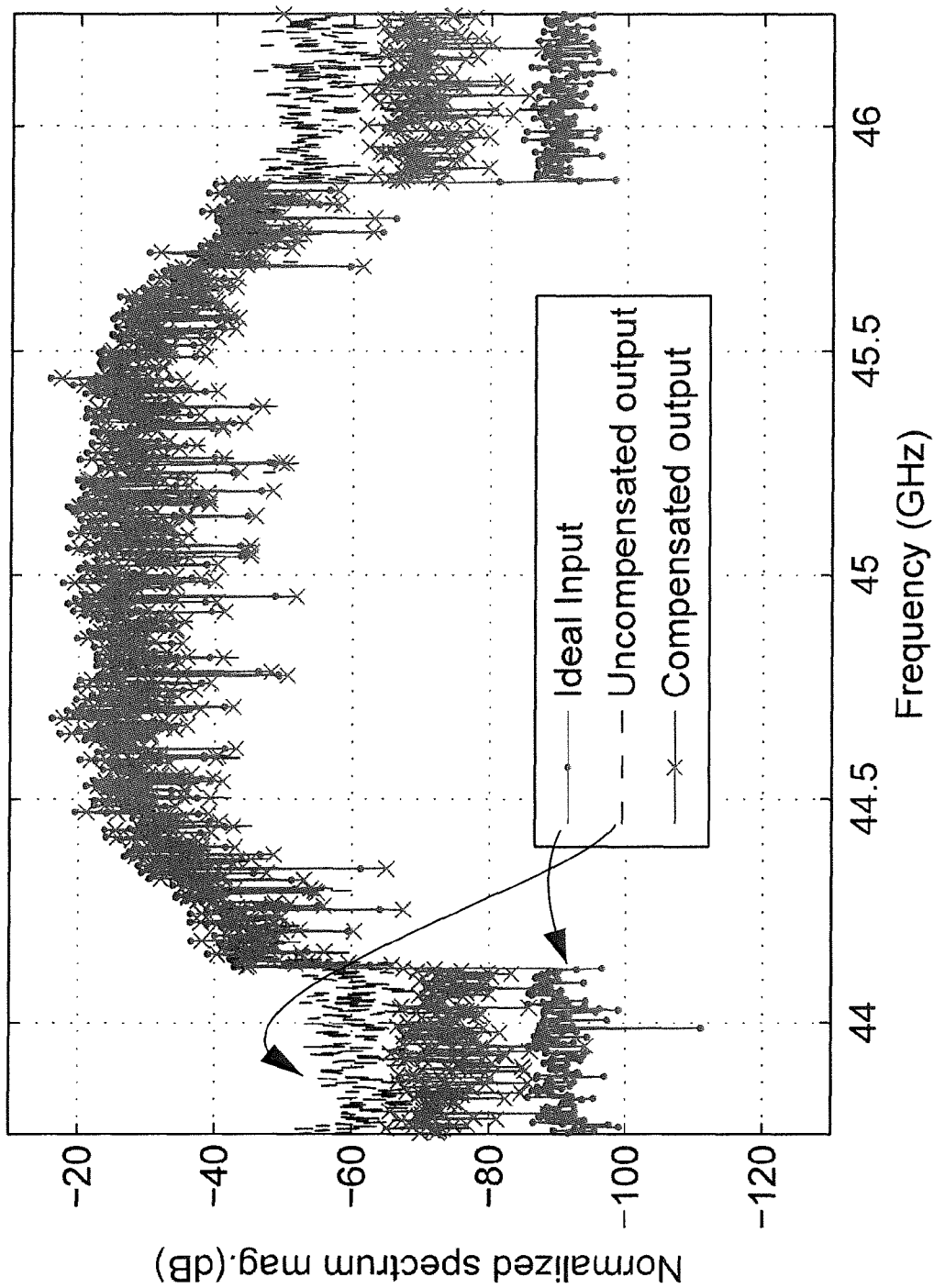
FIG. 16 is a plot of input and output ACPR of an AMO system with $L_{bump}=20$ pH where the input sequence is generated from an offline level-avoidance filter in accordance with an embodiment.

FIGS. 14 and 15 show the EVM comparison before and after the compensation for the 20 pH inductance case. FIG. 16 shows the ACPR improvement accordingly. These results imply both the effectiveness and limitations of digital compensation for different levels of parasitics, and provide a good guideline for PA designers about the capability and conditions necessary for effective digital compensation.

TABLE 4

ACPR and EVM performance of AMO systems with different bump inductances. The input sequences are from offline level-avoidance filtering.

|  | $L_{bump}$ = 5 pH | | $L_{bump}$ = 20 pH | | $L_{bump}$ = 60 pH | |
| --- | --- | --- | --- | --- | --- | --- |
| Iteration | EVM (%) | ACPR (dB) | EVM (%) | ACPR (dB) | EVM (%) | ACPR (dB) |
| 0 | 4.5 | −28.4 | 5.1 | −30.0 | 6.6 | −27.3 |
| 1 | 1.3 | −40.6 | 1.6 | −39.5 | 3.0 | −33.1 |
| 2 | 0.8 | −44.2 | 1.0 | −42.7 | 2.6 | −33.9 |
| 3 | 0.7 | −44.0 | 0.8 | −44.2 | NA | NA |

Aside from testing with different bump inductances, experiments were also performed for the situation where a path delay exists between the phase and amplitude path. Table 5 shows the iteration results on EVM and ACPR improvement with 15 ps path mismatch. As the results suggest, the compensator is capable of fixing any delay-line tuning residual up to 15 ps.

TABLE 5

ACPR and EVM performance of AMO system with 5 pH bump inductance and 15 ps path mismatch between phase and amplitude paths. The input sequence is generated from offline level-avoidance filter.

| Iteration | EVM (%) | ACPR (dB) |
| --- | --- | --- |
| 0 | 5.3 | −29.7 |
| 1 | 5.3 | −29.3 |
| 2 | 1.6 | −38.8 |
| 3 | 1.0 | −41.6 |

Figure 17:
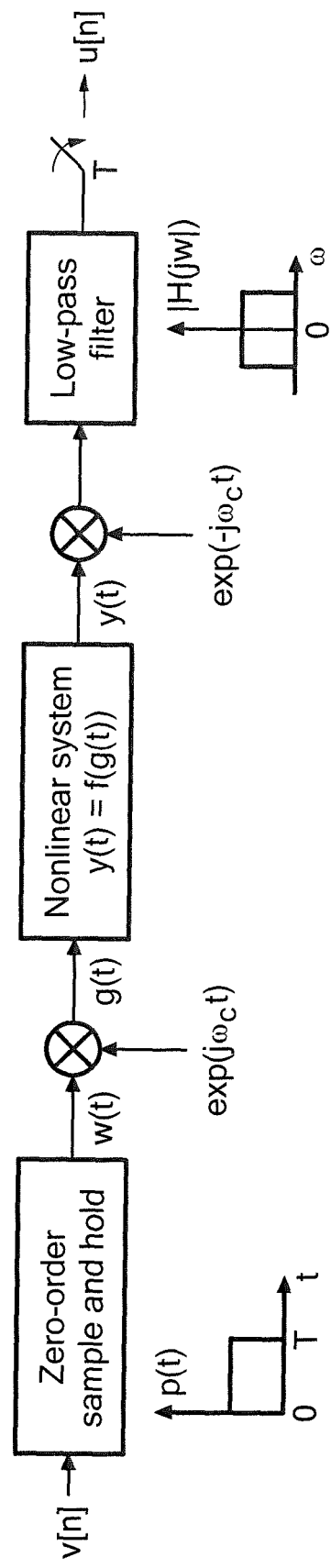
FIG. 17 is a block diagram of an equivalent baseband non-linear system representative of a transmitter and receiver combination.

With the demonstration of a successful off-line compensation through iterations, techniques for building a dynamical model of the compensator will now be discussed. First, it is important and helpful to understand the structure of the equivalent baseband nonlinear system, as shown in FIG. 17. The system has the transmitted and received sample sequences v[n] and u[n] as input and output. Its nonlinear system represents the overall nonlinearity of the whole RF signal chain (e.g., PA, modulator etc.) reflected to baseband.

In FIG. 17, discrete sample sequence v[n] first turns into a continuous-time waveform w(t) through a zero-order sample-and-hold system. Its transfer function's time-domain waveform is depicted as p(t) and T denotes the sample duration. The signal w(t) is modulated to carrier frequency $\omega_c$ as g(t) and transmitted. More accurately, the real part of g(t) is transmitted through the PA. Any nonlinearities along the way of transmission are abstracted in a Volterra series f(t), which is capable of modeling any time-invariant nonlinear system with memory. With g(t) and y(t) being the input and output, respectively, the following equation is obtained:

$$y(t) = k_0 + \sum_{n=1}^{\infty} \int_{-\infty}^{\infty}\int_{-\infty}^{\infty} \ldots \int_{-\infty}^{\infty} k_n(\tau_1, \tau_2, \ldots, \tau_n) g(t-\tau_1) g(t-\tau_2) \ldots g(t-\tau_n) d\tau_1 d\tau_2 \ldots d\tau_n, \quad (28)$$

where $k_n$ is the n-th order kernel. The signal y(t) is then demodulated and filtered in the baseband and the down-sampler samples z(t) with a frequency of 1/T to discrete samples.

According to this signal chain, the characteristics of the equivalent nonlinear baseband system can be found and used as a guideline for the choice of the compensator model structure. In the following, the expressions of the signals along the signal chain from input sequence v[n] to the received sequence u[n] will be shown. The input discrete sample sequence v[n] first transforms to the continuous waveform w(t) as:

$$w(t) = \sum_{k=0}^{\infty} v_k p(t-kT), \quad (29)$$

where $v_k$ is the k-th sample in the time series; p(t) is the rectangular waveform depicted in FIG. 17; and T is the sample duration. After modulation, g(t) may be expressed as:

$$g(t) = w(t) \times e^{j\omega_c t} = \sum_{k=0}^{\infty} v_k p(t-kT) e^{j\omega_c t}, \quad (30)$$

where $\omega_c$ is the carrier frequency. Then g(t) goes through the nonlinear system represented by the Volterra series. To make the derivation more tractable, the Volterra series (Equation (28)) may be considered only up to the second-order nonlinearity, which can be written as:

$$y(t) = \underbrace{k_0}_{y_0(t)} + \underbrace{\int_{-\infty}^{\infty} k_1(\tau_1) g(t-\tau_1) d\tau_1}_{y_1(t)} + \underbrace{\int_{-\infty}^{\infty}\int_{-\infty}^{\infty} k_2(\tau_1, \tau_2) g(t-\tau_1) g(t-\tau_2) d\tau_1 d\tau_2}_{y_2(t)}. \quad (31)$$

The three terms in Equation (31) represent three systems in parallel, hence the three systems can be investigated separately. Since $y_0(t)$ and $y_1(t)$ represent two LTI systems, while $y_2(t)$ represents a nonlinear system with memory, the output from the nonlinear system $y_2(t)$ is focused on in Equation (31). The parameter $y_2(t)$ may then be rewritten with the expression of g(t) substituted therein as follows:

$$y_2(t) = \int_{-\infty}^{\infty}\int_{-\infty}^{\infty} k_2(\tau_1, \tau_2) g(t-\tau_1) g(t-\tau_2) d\tau_1 d\tau_2 = \quad (32)$$

$$\int_{-\infty}^{\infty}\int_{-\infty}^{\infty} k_2(\tau_1, \tau_2) \left( \sum_{l=0}^{\infty} v_l p(t-\tau_1-lT) e^{j\omega_c(t-\tau_1)} \right)$$

$$\left( \sum_{m=0}^{\infty} v_m p(t-\tau_2-mT) e^{j\omega_c(t-\tau_2)} \right) d\tau_1 d\tau_2 =$$

$$\int_{-\infty}^{\infty}\int_{-\infty}^{\infty} k_2(\tau_1, \tau_2) \sum_{l=0}^{\infty}\sum_{m=0}^{\infty} v_l v_m p(t-\tau_1-lT) p(t-\tau_2-mT)$$

$$e^{j2\omega_c t} e^{-j\omega_c(\tau_1+\tau_2)} d\tau_1 d\tau_2.$$

Figure 18:
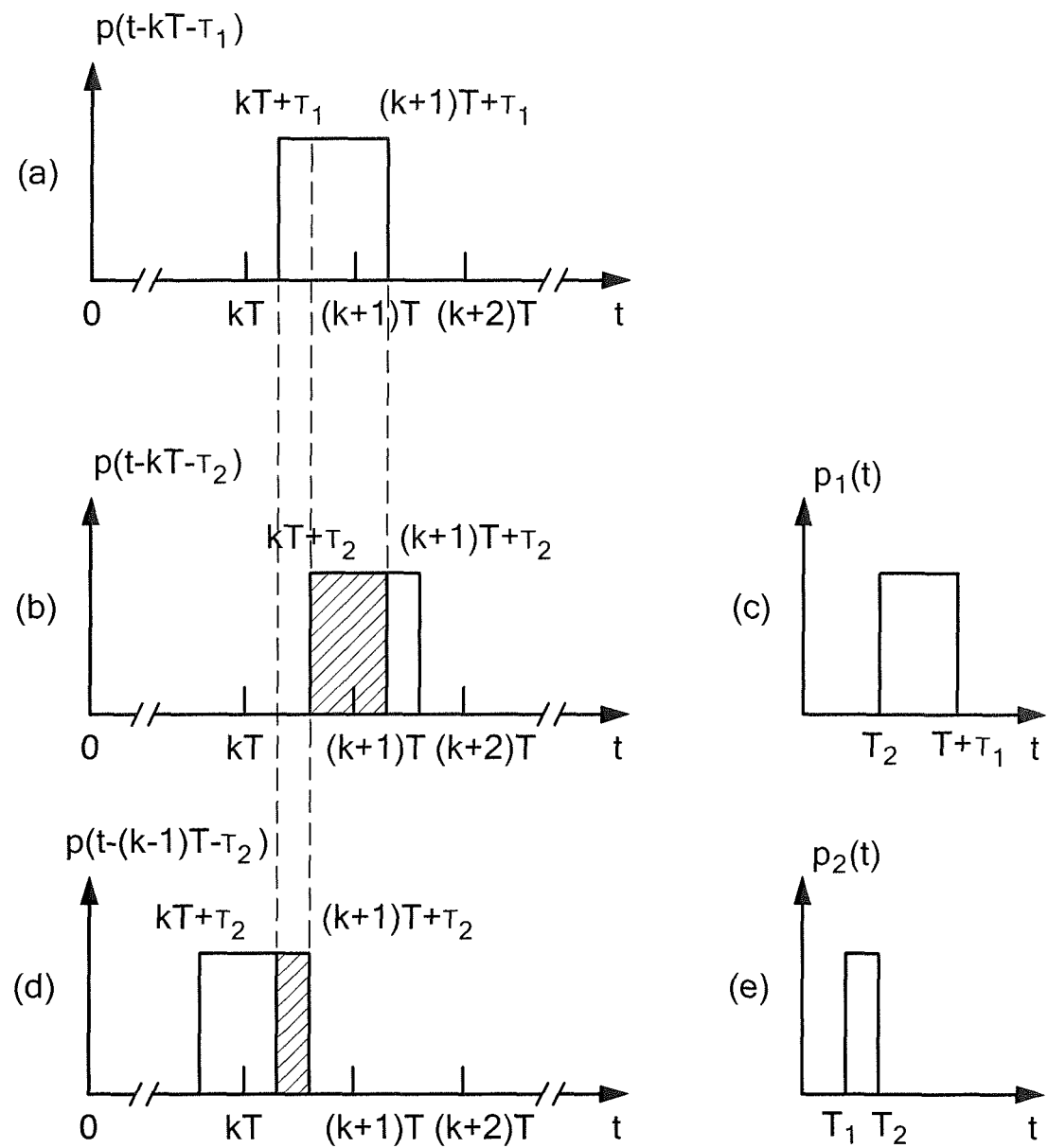
FIGS. 18A-18E are a series of plots illustrating the derivation of nonzero terms in Equation (32)

Among all terms in the double summation, only the terms with overlapping $p(t-\tau_1-lT)$ and $p(t-\tau_2-mT)$ yield nonzero values. FIG. 18 shows an example of nonzero terms with the assumption that the nonlinear system has a memory less than one sample duration, namely $0 < \tau_1 \leq \tau_2 \leq T$. Shown in FIG. 18(a), when index l in the first summation takes a value of k, index m must take k or k−1 as in FIGS. 18(b) and (d) respectively to yield two nonzero terms. The signals $p_1(t)$ and $p_2(t)$ as shown in FIGS. 18(c) and 18(e) result in the following expressions:

$$y_2(t) = \int_{-\infty}^{\infty}\int_{-\infty}^{\infty} k_2(\tau_1, \tau_2) \quad (33)$$

$$\sum_{k=0}^{\infty} [(p_1(t-kT) v_k v_{k+1} + p_2(t-kT) v_k^2) \cdot e^{j2\omega_c t} e^{-j\omega_c(\tau_1+\tau_2)}]$$

$$d\tau_1 d\tau_2. = e^{j2\omega_c t}.$$

$$\sum_{k=0}^{\infty} \left[ v_k v_{k+1} \int_{-\infty}^{\infty}\int_{-\infty}^{\infty} k_2(\tau_1, \tau_2) p_1(t-kT) e^{-j\omega_c(\tau_1+\tau_2)} d\tau_1 d\tau_2 + \right.$$

$$\left. v_k^2 \int_{-\infty}^{\infty}\int_{-\infty}^{\infty} k_2(\tau_1, \tau_2) p_2(t-kT) e^{-j\omega_c(\tau_1+\tau_2)} d\tau_1 d\tau_2 \right]$$

After demodulation, $$z_2(t) = y_2(t) e^{-j\omega_c t} = e^{j\omega_c t} \cdot \quad (34)$$

$$\sum_{k=0}^{\infty} \left[ v_k v_{k+1} \int_{-\infty}^{\infty}\int_{-\infty}^{\infty} k_2(\tau_1, \tau_2) p_1(t-kT) e^{-j\omega_c(\tau_1+\tau_2)} d\tau_1 d\tau_2 + \right.$$

$$\left. v_k^2 \int_{-\infty}^{\infty}\int_{-\infty}^{\infty} k_2(\tau_1, \tau_2) p_2(t-kT) e^{-j\omega_c(\tau_1+\tau_2)} d\tau_1 d\tau_2 \right],$$

where $z_2(t)$ corresponds to the component in z(t) due to the second-order nonlinear system in f(t). In the frequency domain, this may be expressed as:

$$Z_2(j\omega) = \delta(\omega - \omega_c) * \sum_{k=0}^{\infty} (v_k v_{k+1} \cdot H_{1_k}(j\omega) + v_k^2 \cdot H_{2_k}(j\omega)) \quad (35)$$

$$= \sum_{k=0}^{\infty} (v_k v_{k+1} \cdot H_{1_k}(j(\omega-\omega_c)) + v_k^2 \cdot H_{2_k}(j(\omega-\omega_c))),$$

-continued where:

$$H_{1_k}(j\omega) = \int_{-\infty}^{\infty}\int_{-\infty}^{\infty} p_1(t-kT)k_2(\tau_1,\tau_2)e^{-j\omega_c(\tau_1+\tau_2)}d\tau_1 d\tau_2, \quad (36)$$

$$H_{2_k}(j\omega) = \int_{-\infty}^{\infty}\int_{-\infty}^{\infty} p_2(t-kT)k_2(\tau_1,\tau_2)e^{-j\omega_c(\tau_1+\tau_2)}d\tau_1 d\tau_2.$$

Low-pass filtering and downsampling follow, which lead to the spectrum expression for the nonlinear part of u[n] as:

$$U_2(e^{j\Omega}) = \sum_{k=0}^{\infty}(\underbrace{v_k v_{k+1}}_{NL}\underbrace{H_{1_k}(e^{j(\frac{\Omega}{T}-\frac{2\pi r}{T})})}_{LTI} + \underbrace{v_k^2}_{NL}\underbrace{H_{2_k}(e^{j(\frac{\Omega}{T}-\frac{2\pi r}{T})})}_{LTI}),$$

where $r = \frac{\omega_c}{\omega_s}$, and $\omega_s = \frac{2\pi}{T}$.

Figure 19:
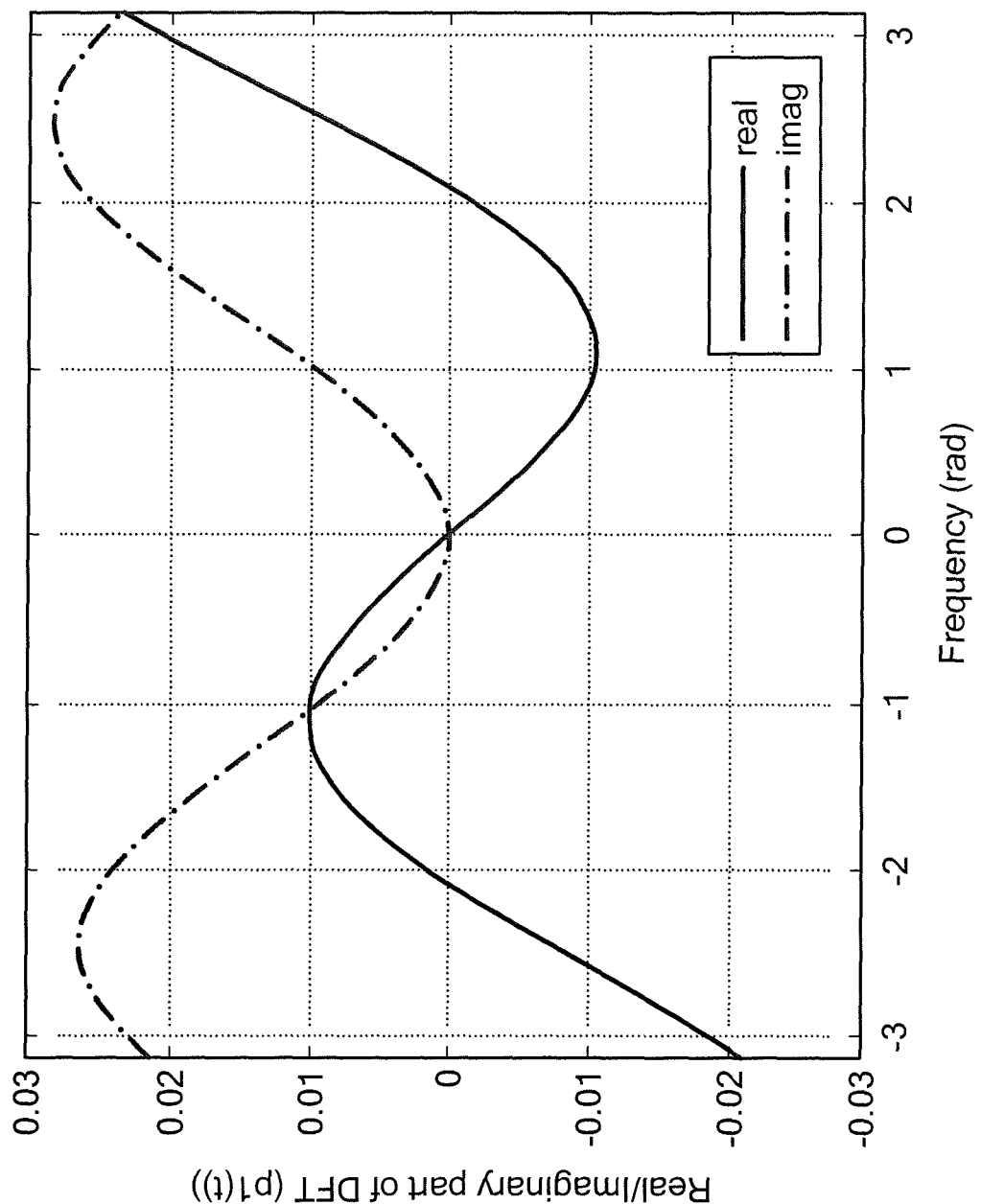
FIG. 19 is a plot illustrating the real and imaginary parts of a discrete Fourier transform (DFT) of function $p_1$ showing that the spectrum has a discontinuity at $\pm \pi$.

Equation (37) shows the nonlinear part of the output of the baseband equivalent system in an example of second-order nonlinearity and memory within one sample duration. It can be seen that the structure of the output consists of two parts: a nonlinear transformation involving the current and previous samples, represented by $v_k^2$ and $v_k v_{k+1}$ (noted as NL in Equation (37)), and a linear time-invariant (LTI) system (noted as LTI in Equation (37)). A closer examination of the LTI system $H_{1_k}$ reveals that it is the output of the signal $p_1(t-kT)$ through another LTI system. FIG. 19 shows the real and imaginary parts of the DFT of $p_1$ (i.e.)

$$\left(\text{i.e., } P_1(e^{j(\frac{\Omega}{T}-\frac{2\pi r}{T})})\right)$$

shown in Equation (38), $$P_1(e^{j(\frac{\Omega}{T}-\frac{2\pi r}{T})}) = \frac{e^{-j(\frac{\Omega}{T}-\frac{2\pi r}{T})\tau_1} - e^{-j(\frac{\Omega}{T}-\frac{2\pi r}{T})\tau_2}}{j(\frac{\Omega}{T}-\frac{2\pi r}{T})}. \quad (38)$$

An important observation is that the spectrum has a discontinuity at $\pm\pi$, which translates to a long memory in time-domain. In the situation where the system uses a high oversampling ratio from symbol to sample space, this discontinuity has less effect on the band containing symbol information. In another situation where a lower oversampling ratio is used, this discontinuity leads to a more significant effect on the band with symbol information. In high-speed wideband communication systems, the oversampling ratio is usually limited by the speed that the digital baseband and DAC are able to sustain, therefore the latter scenario described is usually encountered and the compensator model should be able to take care of this factor.

The off-line compensation through iterations hereinabove not only confirms the possibility of achieving an effective compensator, but also provides input-output pairs of the compensator. However, it does not serve the purpose of compensating in real-time. The compensator coming out of the iterations only compensates the pre-determined input sample sequence and the iteration scheme becomes infeasible for real-time situations. Therefore, having obtained the knowledge of the nonlinear system under compensation, the following discussion is devoted to the effort of modeling the compensator as a dynamical system so that an integrated mixed-signal transmitter system is feasible.

Figure 20:
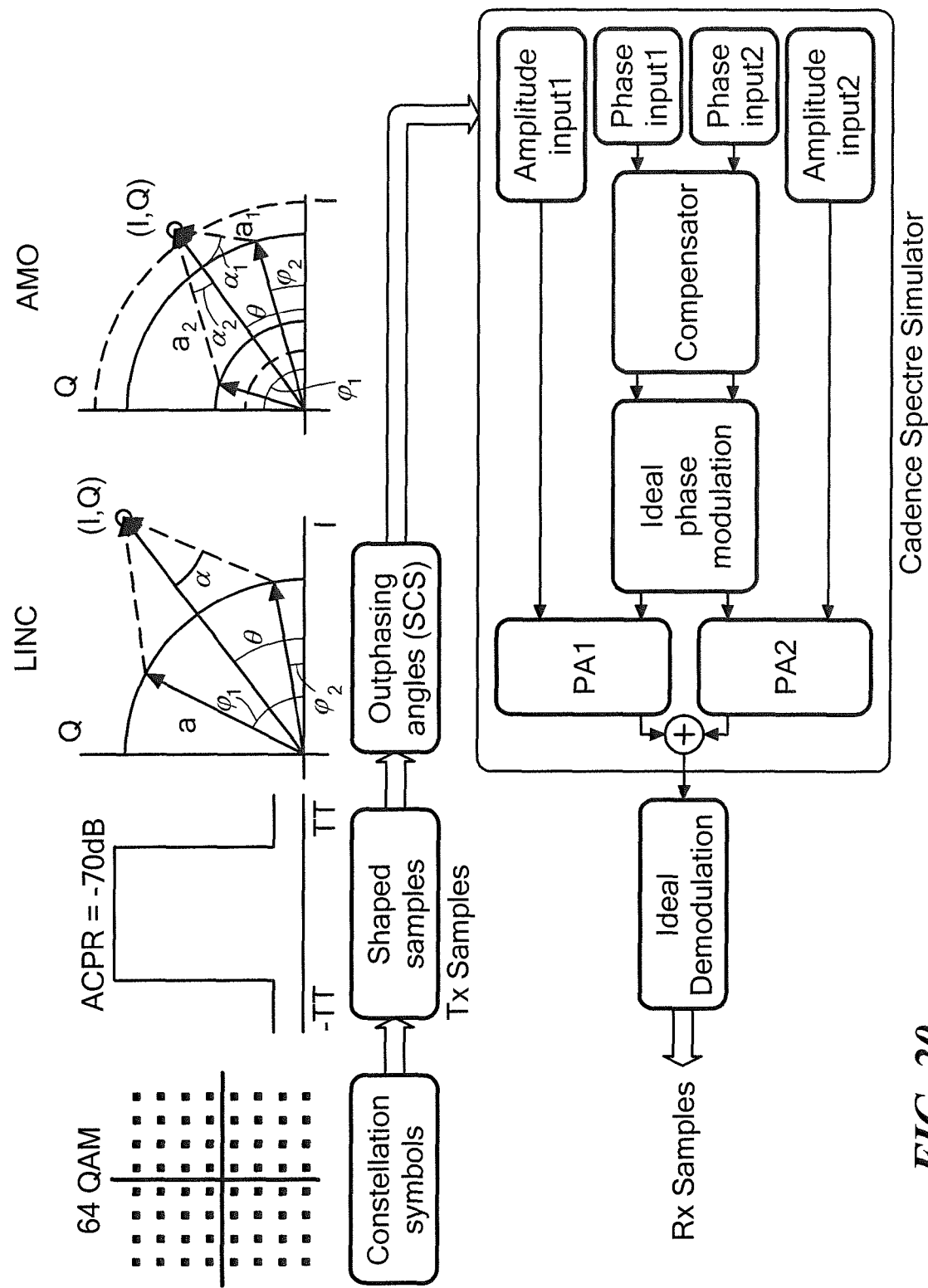
FIG. 20 is a block diagram illustrating an exemplary placement of a compensator in the simulation setup of FIG. 3.

The placement of the compensator is the first question that needs to be answered. From FIG. 3, it is seen that there are two possible options. One option is to compensate after the "Shaped samples" block and before the SCS, while the other option is to compensate after the SCS. The problem with the former comes from the SCS. Because of its nonlinear and discontinuous nature, it is hard to take the SCS into account while modeling the compensator. For example, for an AMO system, a compensated sample $V_c$ may fall into a different decomposition region compared to its uncompensated counterpart V. As a result, since the compensator is built with the knowledge of V, the system being compensating would be different from the one the model is built on. Therefore, the latter option is chosen and the compensator is placed on the two phase paths to correct the phase signals to the PAs, as shown in FIG. 20. With this placement, the compensator is free of any trouble caused by the SCS and only needs to compensate the nonlinear system from the phase signal to the received sample.

As discussed previously, the equivalent nonlinear baseband system can be represented as a concatenation of a nonlinear transformation with short memory followed by an LTI system with discontinuities at $\pm\pi$. Furthermore, the dynamical system of Equation (39) represents the input to the difference between the output and input follow the same structure.

$$V \rightarrow \Delta(V) = y(V) - V. \quad (39)$$

Since $\Delta(V)$ is relatively small compared to input V, the inversion of the input to output function, namely $(V+\Delta(V))^{-1}$ can be approximated by $V-\Delta(V)$. The approximation also corresponds to the first iteration of the off-line compensation, which provides most of the gain throughout all iterations. Therefore, the inversion can be approximated with the same structure as the forward nonlinear system.

Figure 21:
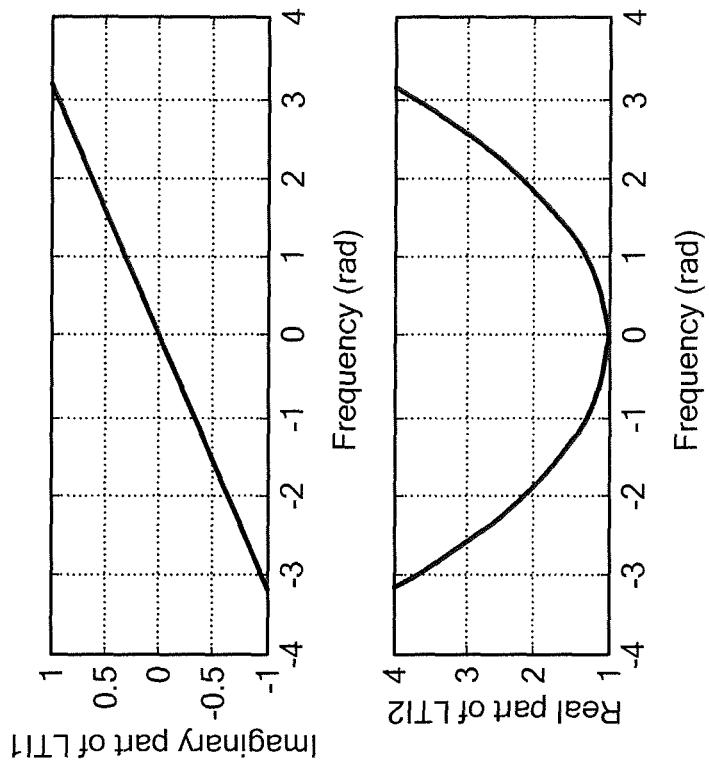
FIG. 21 is a block diagram illustrating an exemplary compensator structure for use with a LINC system.
Figure 21:
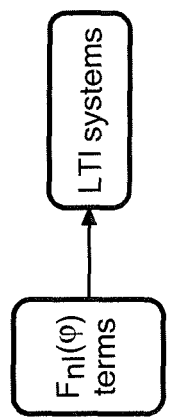

For the LINC system, the model structure shown in FIG. 21 is used. The first part represents the nonlinear function basis terms in a trigonometric polynomial with one memory, which may be expressed as:

$$F_{nl}(\phi) = \sum_{i=1}^{N} a_i \cos(k_{1i}\phi + k_{2i}\phi_d) + b_i \sin(k_{1i}\phi + k_{2i}\phi_d), \quad (40)$$

where $\phi$ is the input phase; $\phi_d$ is the one-sample delayed version of $\phi$; $a_i$, $b_i$ are the design variables; $k_{1i}$, $k_{2i}$ are a set of known coefficients determined by the degree of the trigonometric polynomial; and N is the number of the terms in the polynomial.

As an example of $k_{1i}$ and $k_{2i}$ values, if the maximal degree on both $\phi$ and $\phi_d$ is 2, then the set of $(k_{1i}, k_{2i})$ is:

$$\{(0,0),(1,0),(2,0),(-2,1),(-1,1),(0,1),(1,1),(2,1),(-2,2),$$
$$(-1,2),(0,2),(1,2),(2,2)\}. \quad (41)$$

Figure 22:
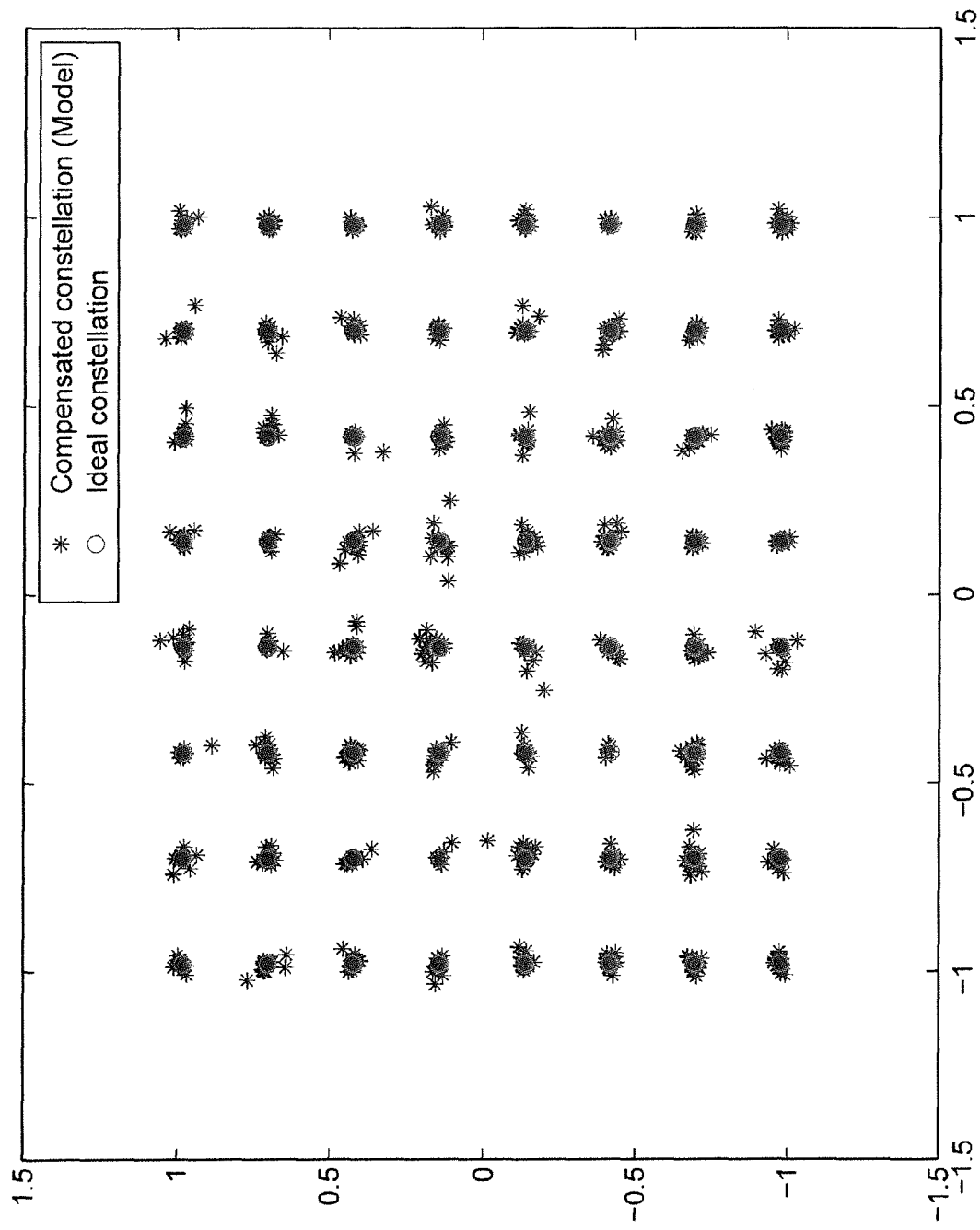
FIG. 22 is a plot of EVM of a LINC system with a real-time compensator and a real-time zero-avoidance filter.
Figure 23:
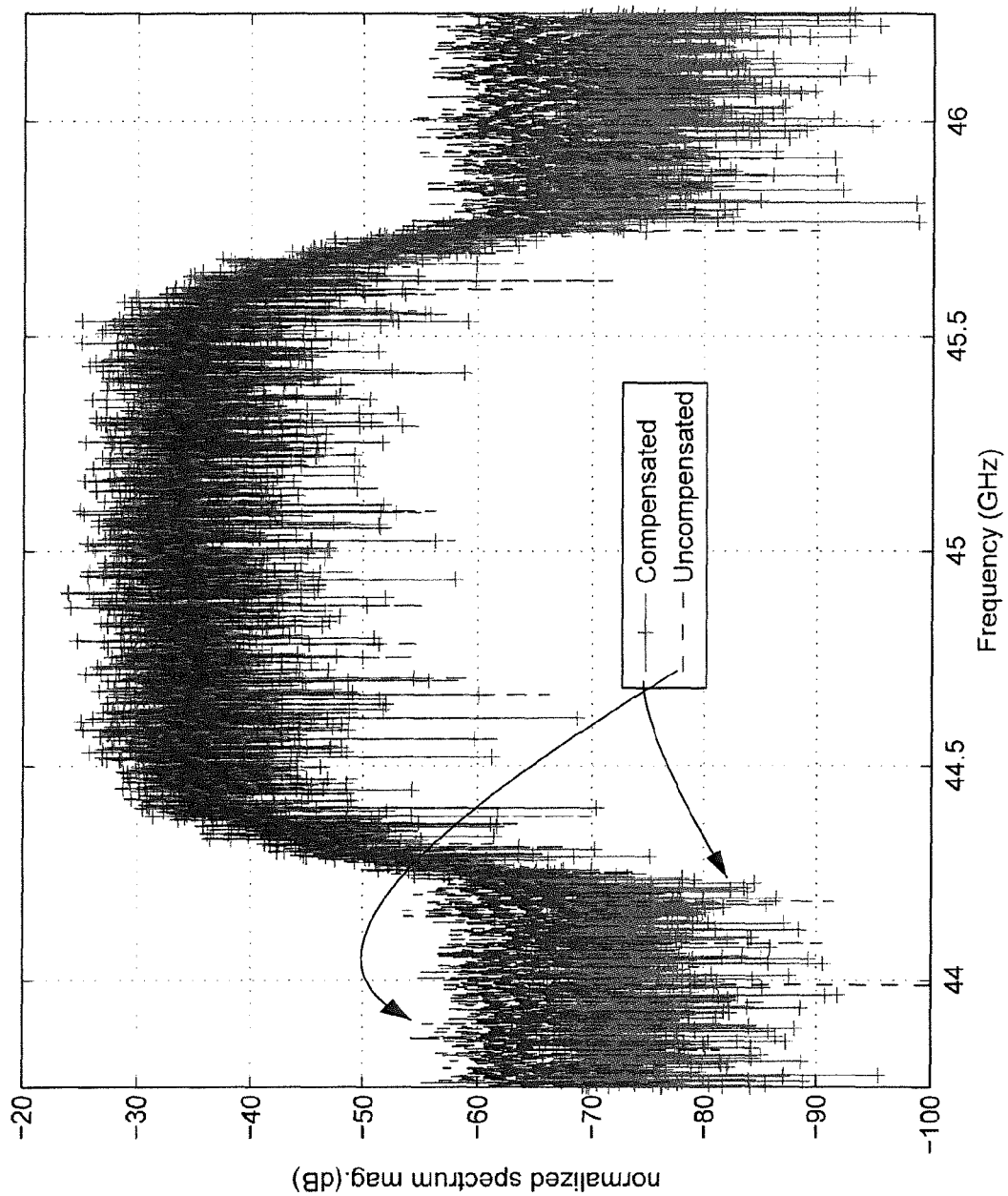
FIG. 23 is a plot of ACPR of a LINC system with a real-time compensator and a real-time zero-avoidance filter.

The second part of the compensator structure consists of the LTI functions with discontinuities at $\pm\pi$. FIG. 21 shows the two LTI functions that are used in the fitting. The upper plot shows an LTI system with linear response in frequency, hence its imaginary part is plotted in the figure and the real part is zero. The lower plot shows an LTI system with a second-order response in frequency, hence its real part is as plotted and the imaginary part is zero. With this model structure and a polynomial degree of less than 15 on both current and previous phases, an EVM performance improvement from 4.5% to 2.5% and an ACPR performance improvement from −30 dB to −39 dB may be achieved. The corresponding EVM and ACPR improvements are shown in FIG. 22 and FIG. 23, respectively.

Figure 24:
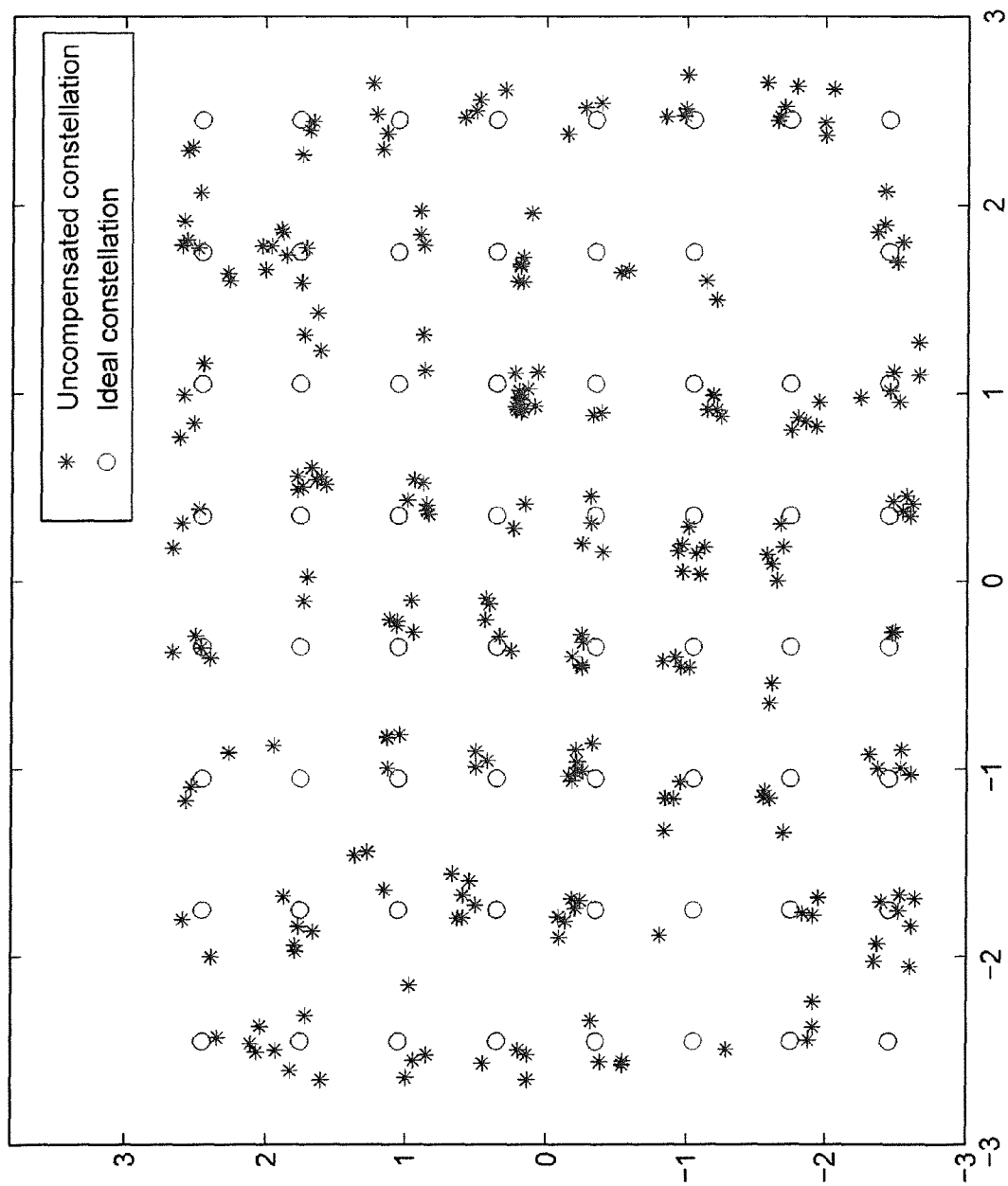
FIG. 24 is a plot of EVM of an AMO system without a real-time compensator.
Figure 25:
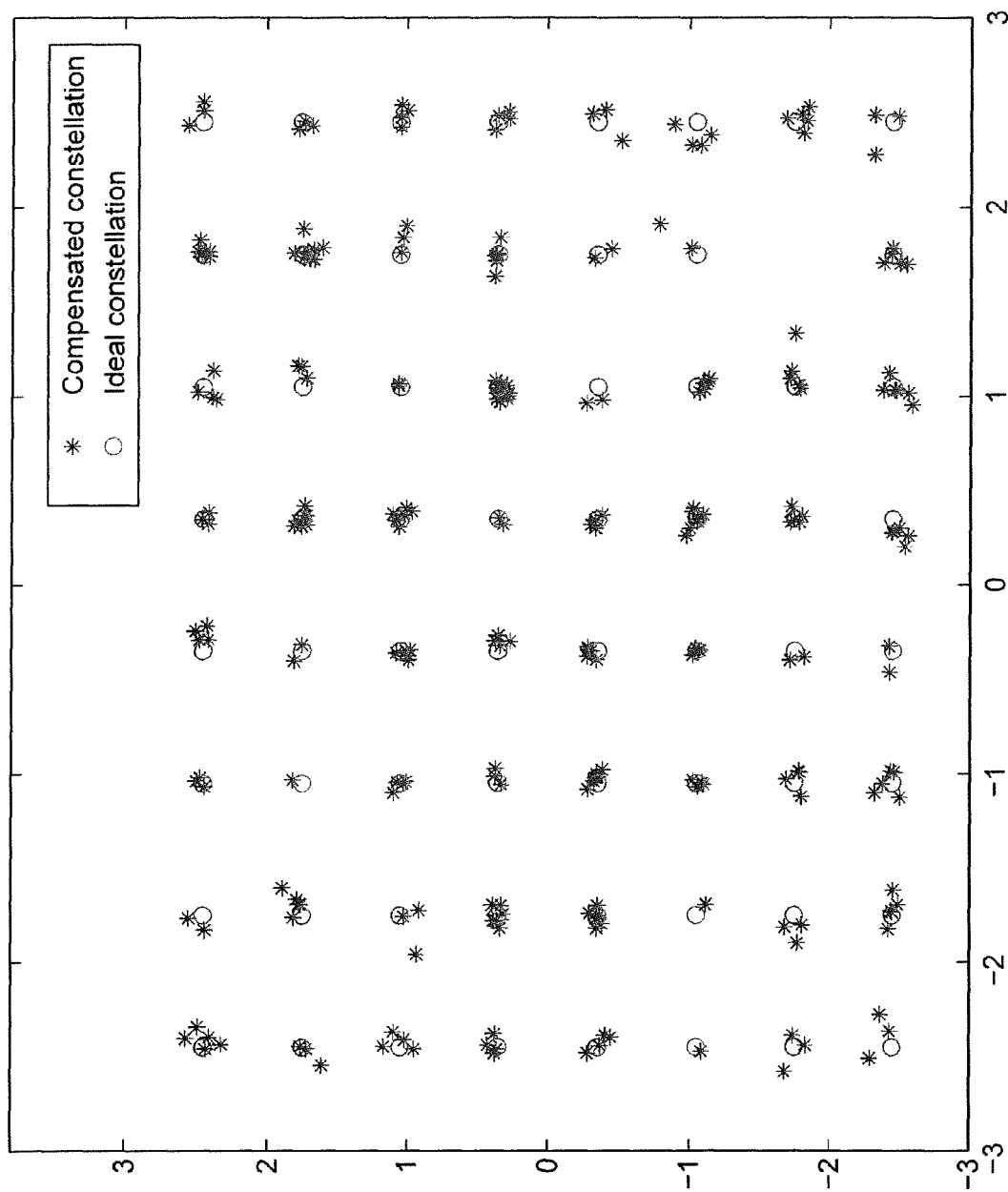
FIG. 25 is a plot of EVM of an AMO system with a real-time compensator and an offline level-avoidance filter.
Figure 26:
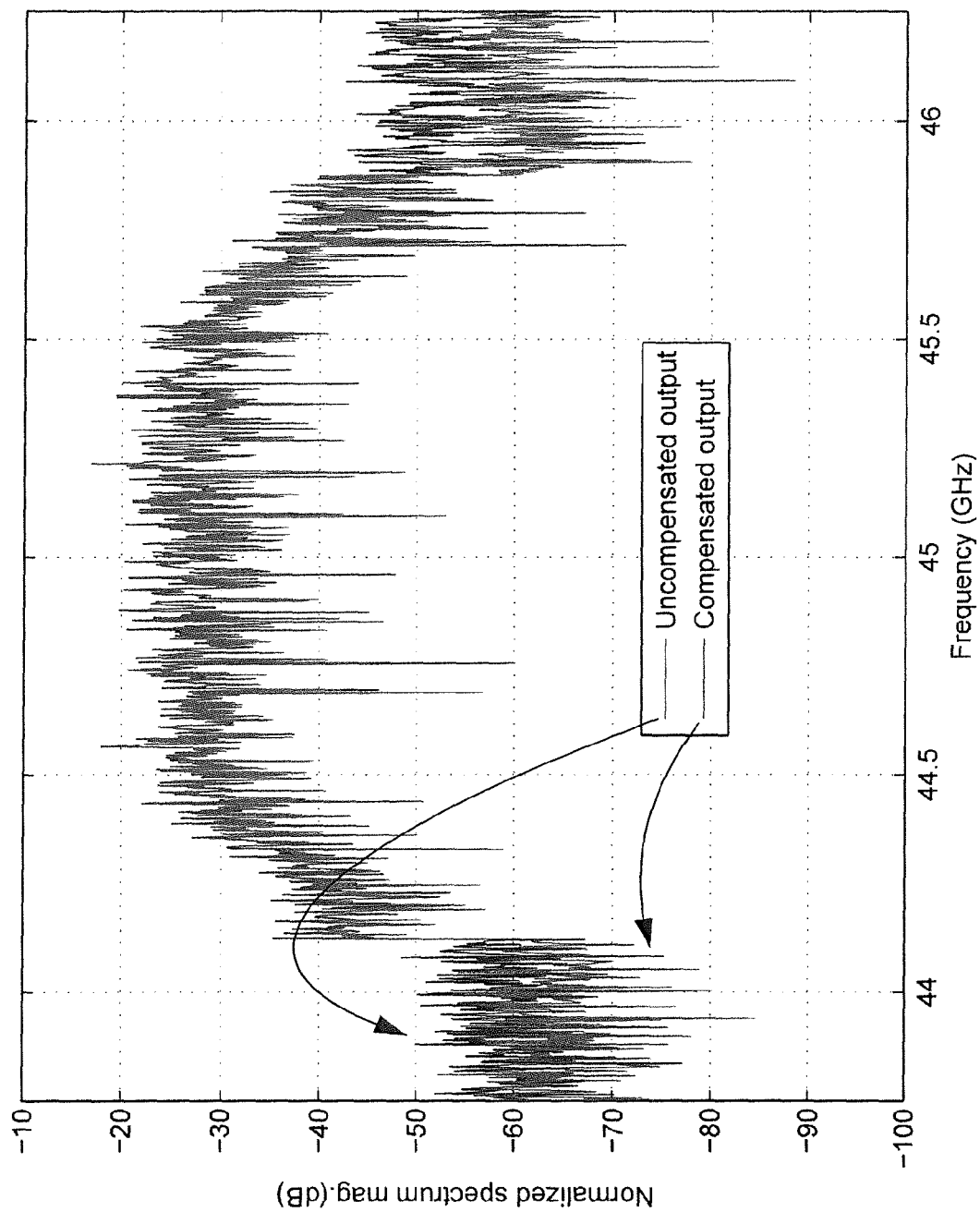
FIG. 26 is a plot of ACPR of an AMO system with a real-time compensator and an offline level-avoidance filter.

For the AMO system, the nonlinear transformation part should also take the amplitudes from the two paths as inputs, as in:

$$F_{nl}(\phi, a) = g(a) \cdot \left( \sum_{i=1}^{N} a_i \cos(k_{1i}\phi + k_{2i}\phi_d) + b_i \sin(k_{1i}\phi + k_{2i}\phi_d) \right), \quad (42)$$

where g(a) represents a polynomial function on the amplitude input. In our experiment, a linear function is used on the current and previous amplitude values for each path. After fitting with the design variables $a_i$ and $b_i$, the following improved system is obtained. With 5 pH bump inductance and power switching levels confined to 1.1V and 2.2V, the EVM decreases from 6.7% to 2.7% and ACPR from −27.4 dB to −36.2 dB. The comparison of the EVM with and without the compensator is shown in FIGS. 24 and 25, respectively, and the ACPR result is shown in FIG. 26.

To fully test the model for a real system, the digital baseband containing both the SCS functionality and the compensator was implemented and integrated with the analog frontend including the digital-analog interface, the modulator, the PA, and power supply switches as an overall integrated system solution for a wideband mm-wave transmitter. The hardware implementation of the compensator is designed to provide the functionality of the model tested with the simulation data, but is not limited to it. To make full use of the silicon area to prepare for circumstances that are different from simulator predictions, the hardware was made as flexible as possible.

Figure 28:
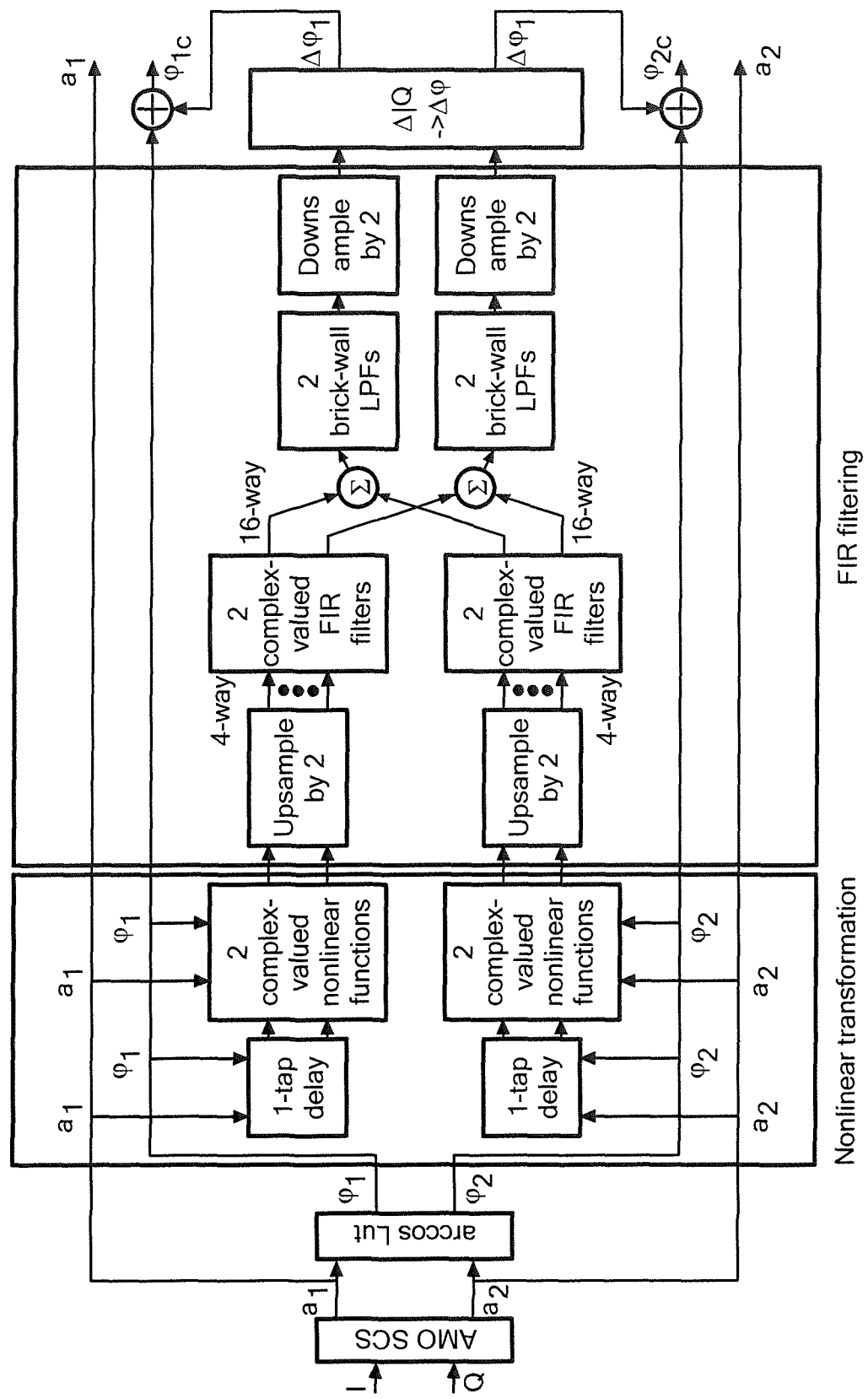
FIG. 28 is a block diagram illustrating an exemplary hardware implementation of a compensator.

FIG. 28 is a block diagram illustrating an exemplary compensator in accordance with an embodiment. The compensator takes the amplitude signals $a_1$, $a_2$, and outphasing angles $\phi_1$, $\phi_2$ as inputs and produces correction signals $\Delta\phi_1$ and $\Delta\phi_2$ which are added to $\phi_1$, $\phi_2$, respectively, and passed to the rest of the digital baseband system. The compensator consists of two major parts, corresponding to the nonlinear transformation and LTI system structures in Section 2.4. These parts are shown in FIG. 28 in two different boxes. To be more flexible, the nonlinear transformation and LTI system structures have two replicas in the compensator in case the nonlinear system has two modes of behavior (e.g., two different singular value decomposition (SVD) related modes).

As shown in FIG. 28, the nonlinear transformation portion of the compensator takes signals $\phi_1$, $\phi_2$, $a_1$, $a_2$, and their one-sample delayed versions as inputs, uses 2 complex-valued nonlinear functions (as in two modes) and produces 2 complex outputs, or effectively 4 real outputs for each PA. The nonlinear functions are implemented with piece-wise linear approximation in two dimensions, an extension from the one dimensional piece-wise linear technique used in the SCS implementation. Although illustrated in FIG. 28 with a one-tap delay for each non-linear function block, it should be appreciated that multi-tapped delays may be used in other embodiments.

The second part of the compensator structure of FIG. 28 is an LTI system with discontinuities at ±π. As shown in the figure, the LTI portion takes the 4 real outputs from each PA and produces the correction signals ΔI and ΔQ. Suppose an LTI system needs to be realized that has a transfer function with real or imaginary parts as shown in FIG. 27(d). One approach is to directly use an FIR filter to approximate the impulse response. However, the FIR approximation will have a large number of taps because of the discontinuities. Furthermore, since each complex-valued FIR has a complex input, and there are two modes and two PA paths, there will be 2×2×2×2=16 effective real-input real-coefficient FIR filtering computations in total. As will be appreciated, it can be expensive in power and area to implement 32 long-tap FIRs of this type.

Figure 27A:
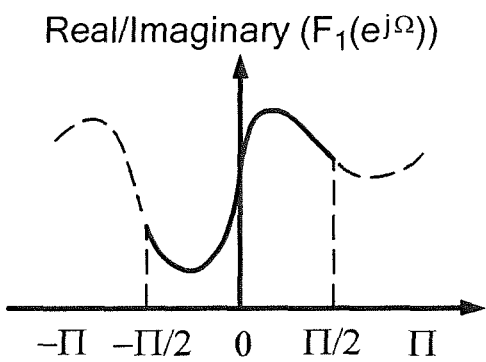
FIGS. 27A-27D are a series of plots which illustrate construction of an LTI system with discontinuities at ±π.
Figure 27B:
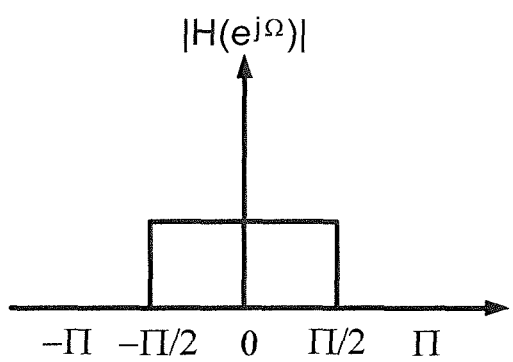
Figure 27C:
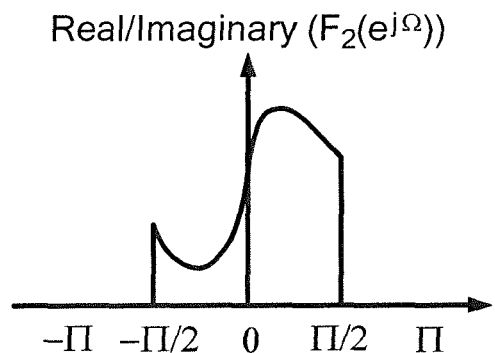
Figure 27D:
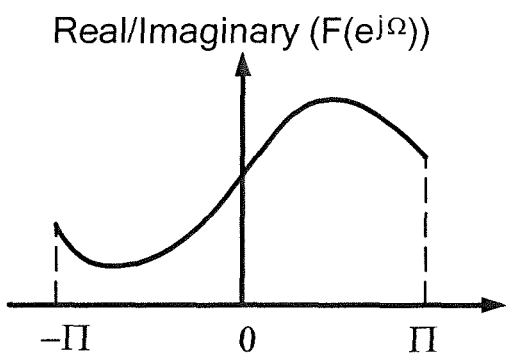

An alternative approach is illustrated in FIGS. 27(a)-(d). The idea is to first upsample the system by 2 (or some other value) in the time-domain by use of two-way interleaving in hardware. This leads to the desired transfer function $F(e^{j\Omega})$ scaled in frequency to $[-\pi/2, \pi/2]$, and the transfer function in the frequency range $[-\pi, \pi/2]$ and $[\pi/2, \pi]$ can then be designed such that the new transfer function $F_1(e^{j\Omega})$ is continuous at ±π, as shown in FIG. 27(a). Then the output from the newly designed LTI system $F_1$ passes through the linear-phase brickwall filter shown in FIG. 27(b) and produces the frequency response shown in FIG. 27(c). Finally, the desired frequency response is achieved by downsampling by 2. The advantage of this approach is that the impulse response of $F_1(e^{j\Omega})$ can be realized with a short-tap FIR, and though the linear-phase brickwall filter matches to a long-tap FIR, it is shared by several short FIRs from different modes from two PA paths. Therefore, in the "FIR filter" blocks of FIG. 28, for each PA, there are 4 complex inputs interleaved in two-way, and passed through 2 complex-valued short-tap FIR filters, thereby producing 4×2×2=16 ways of results in hardware. The real and imaginary parts from the total 32-way results may then be combined together into 4 ways, which are still in the two-way interleaved fashion, and passed through the 4 long-tap brickwall filters. As a result, the number of long tap FIRs may be reduced from 16 to 4.

After downsampling, there is one last conversion block to convert ΔI, ΔQ to $\Delta\phi_1$, $\Delta\phi_2$, which translates the correction signals from Cartesian coordinates to polar coordinates. The formulation is obtained by taking the full derivatives on the functions $I(\phi_1,\phi_2)$ and $Q(\phi_1,\phi_2)$, where:

$$I(\phi_1,\phi_2) = a_1 \cos(\phi_1) + a_2 \cos(\phi_2),$$

$$Q(\phi_1,\phi_2) = a_1 \sin(\phi_1) + a_2 \sin(\phi_2). \quad (43)$$

This results in:

$$\Delta\phi_1 = \frac{\Delta I \cos\phi_2 + \Delta Q \sin\phi_2}{a_1 \sin(\phi_1 - \phi_2)} \quad (44)$$

$$\Delta\phi_2 = \frac{\Delta I \cos\phi_1 + \Delta Q \sin\phi_1}{a_2 \sin(\phi_2 - \phi_1)}.$$

Figure 29:
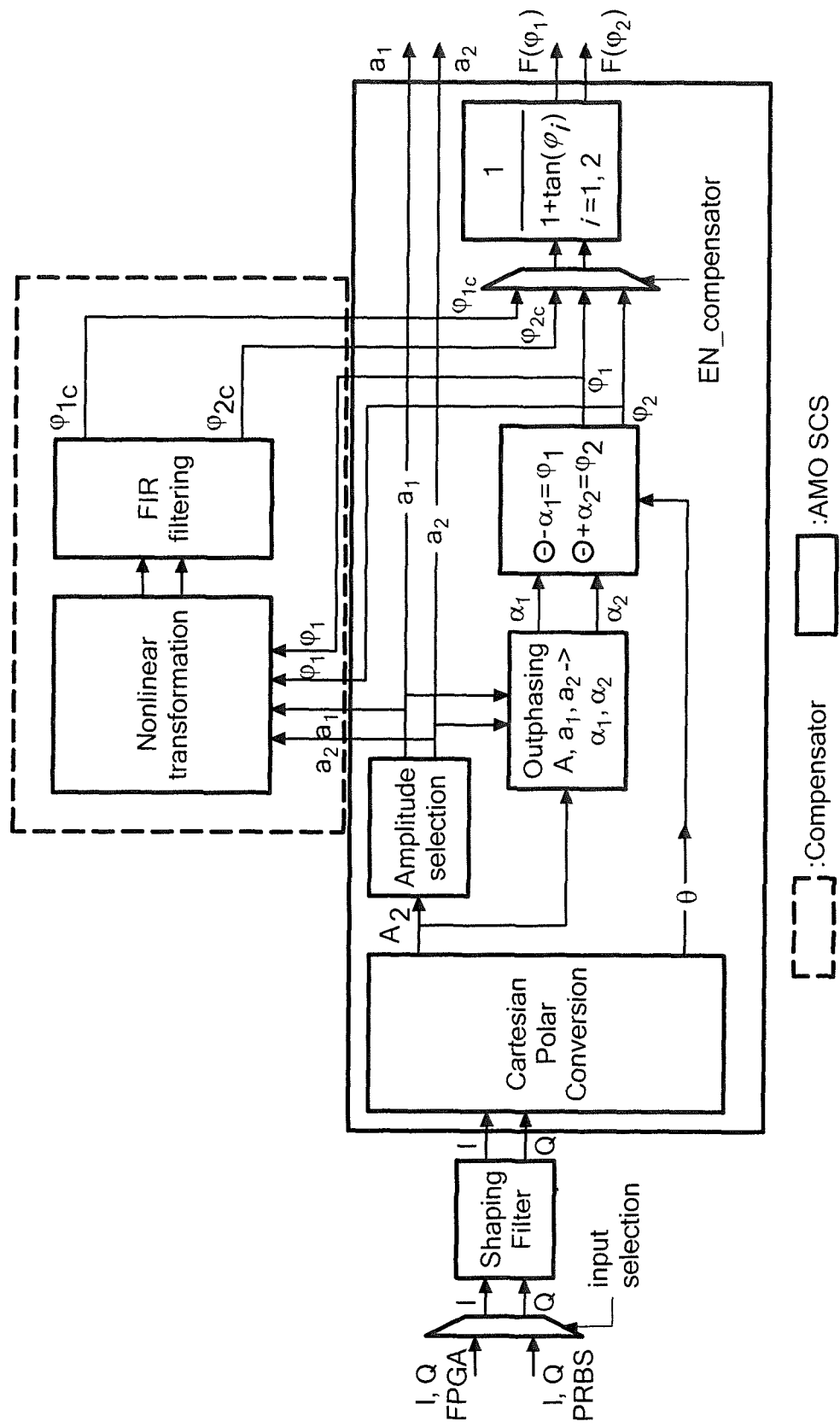
FIG. 29 is a block diagram illustrating an exemplary digital baseband having an AMO signal component separator (SCS) and a nonlinear compensator.

FIG. 29 is a block diagram illustrating an exemplary digital baseband system that includes the compensator structure described above in accordance with an embodiment. As shown, the digital baseband system of FIG. 29 includes both the SCS functionality and the nonlinear compensation functionality. In the illustrated embodiment, the system can accept the input symbol from either an FPGA board or an on-chip PRBS, and the shaping filter generates the shaped samples to AMO SCS. The SCS uses a single-way to process the computations and provide the amplitude and phase signals along the way to the compensator. The nonlinear compensator outputs the corrected phases and a compensator enabling signal may be used to select whether to output the compensated phases or uncompensated phases. This selection functionality was provided primarily to allow comparison between compensated and uncompensated results and is not required in a completed system (i.e., the compensated phases may always be used in some embodiments). As shown in FIG. 29, a $$\frac{1}{1+\tan\phi}$$

block may be provided to compute the output using the corrected phases. The overall system is an integration of the digital baseband, digital-analog interface, the phase modulator, and the 16-way PA.

Figure 30:
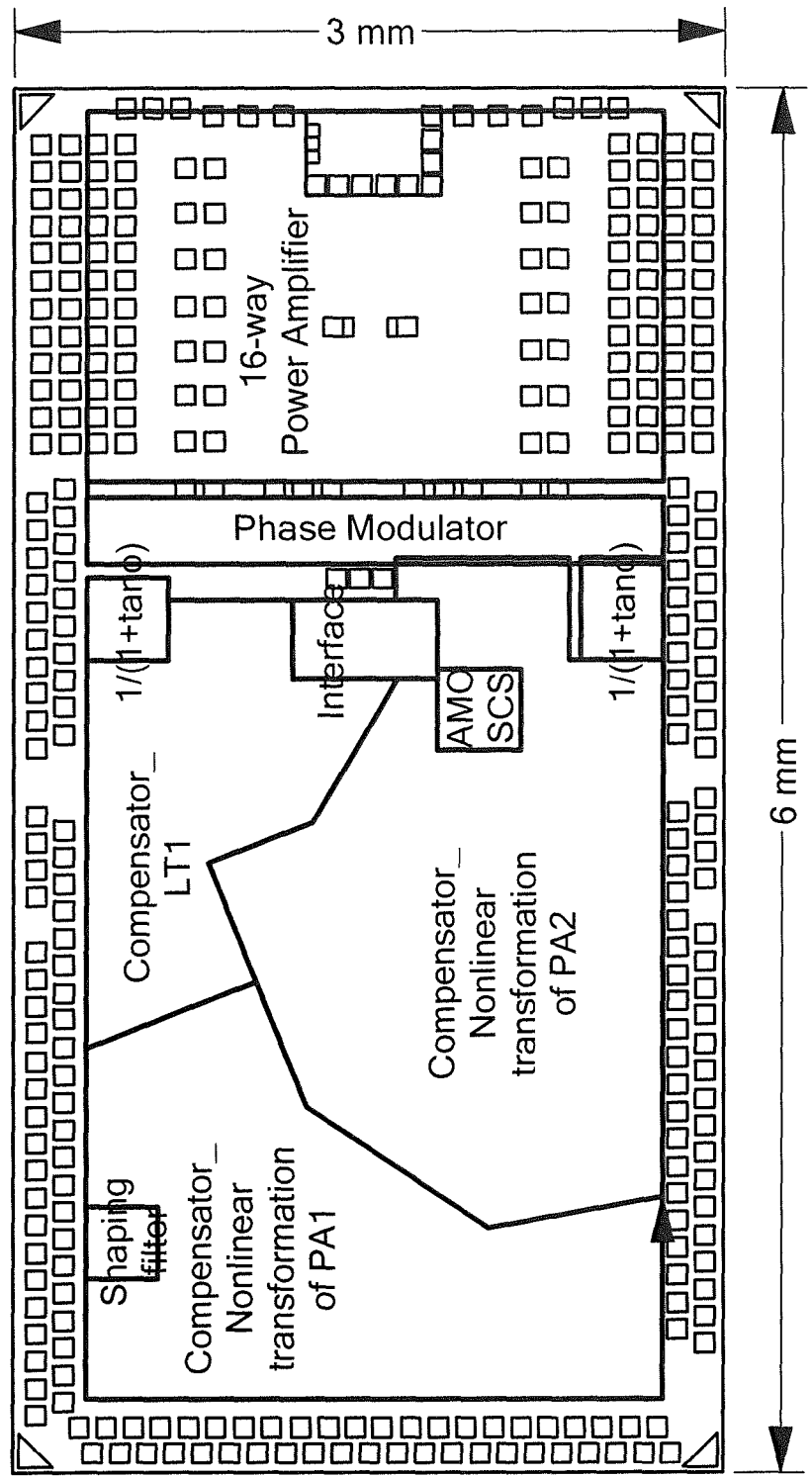
FIG. 30 is a diagram illustrating an exemplary integrated transmitter system having digital baseband nonlinear compensation.

FIG. 30 shows the placement of the major design blocks in an exemplary embodiment. As illustrated, there are compensator sub-blocks, a phase modulator, and a 16-way PA block from left to right. In the exemplary digital baseband design, in order to leave enough room for design space exploration of the compensator, all the parameters in the compensator are programmable and they are implemented with registers, hence the compensator consumes the majority of the area and the AMO SCS occupies a relatively small block in the middle. In one embodiment, the chip is fabricated with a 45 nm SOI process and consumes an area of 3 mm×6 mm with a total of 4,964,489 standard cell gates. Other processes and sizes may alternatively be used.

Figure 31:
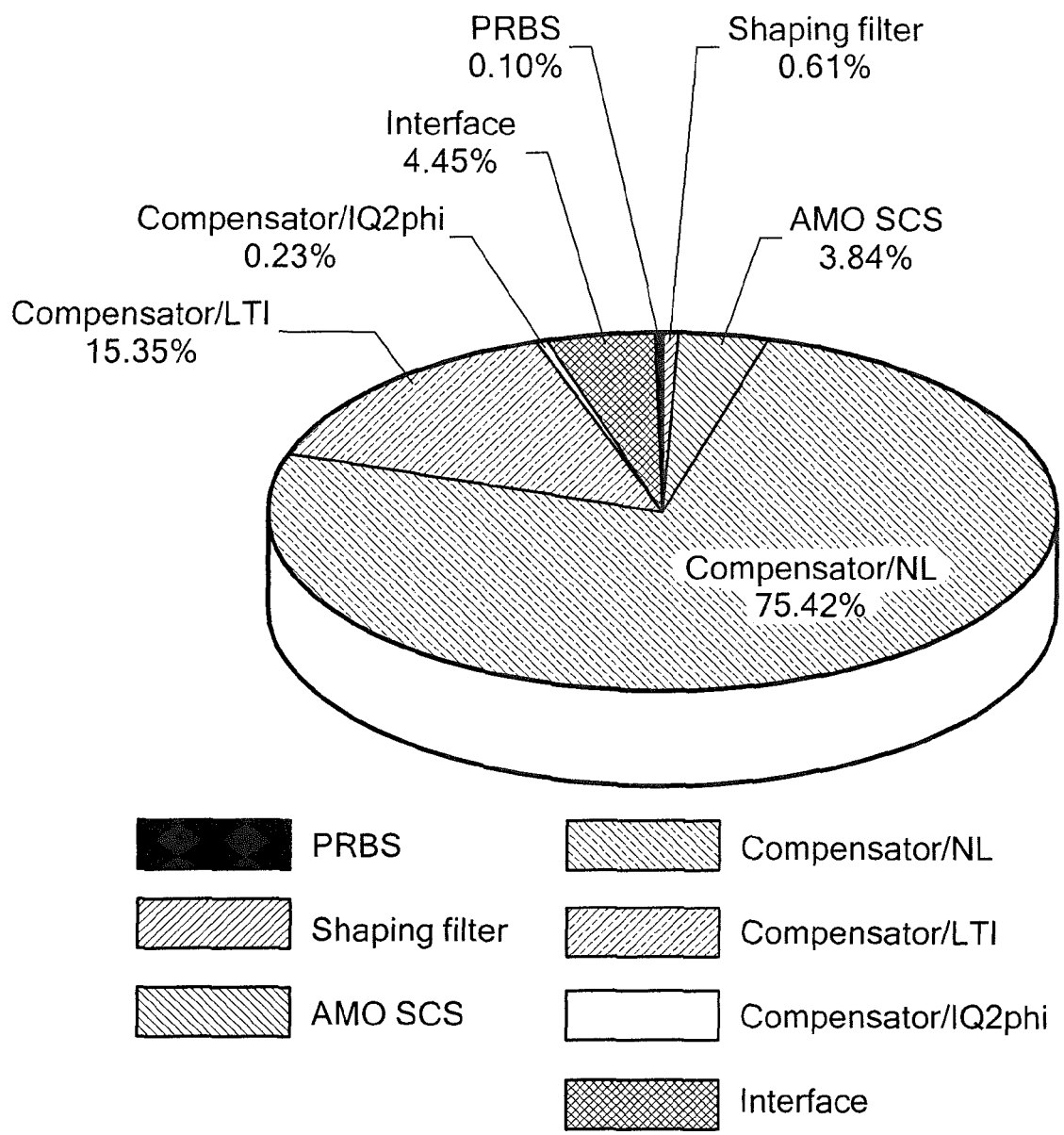
FIG. 31 is a pie chart illustrating an exemplary area breakdown for various components of an AMO system having a nonlinear compensator.

FIG. 31 shows the area breakdown of the digital baseband blocks. As illustrated, the majority of the area is consumed by the compensator nonlinear transformation and filtering blocks. The nonlinear transformation portion has 4 complex-valued nonlinear functions realized by a 2-dimensional piece-wise linear approximation and the filtering portion includes 4 100-tap FIR filters and thus consumes a large area.

Figure 32:
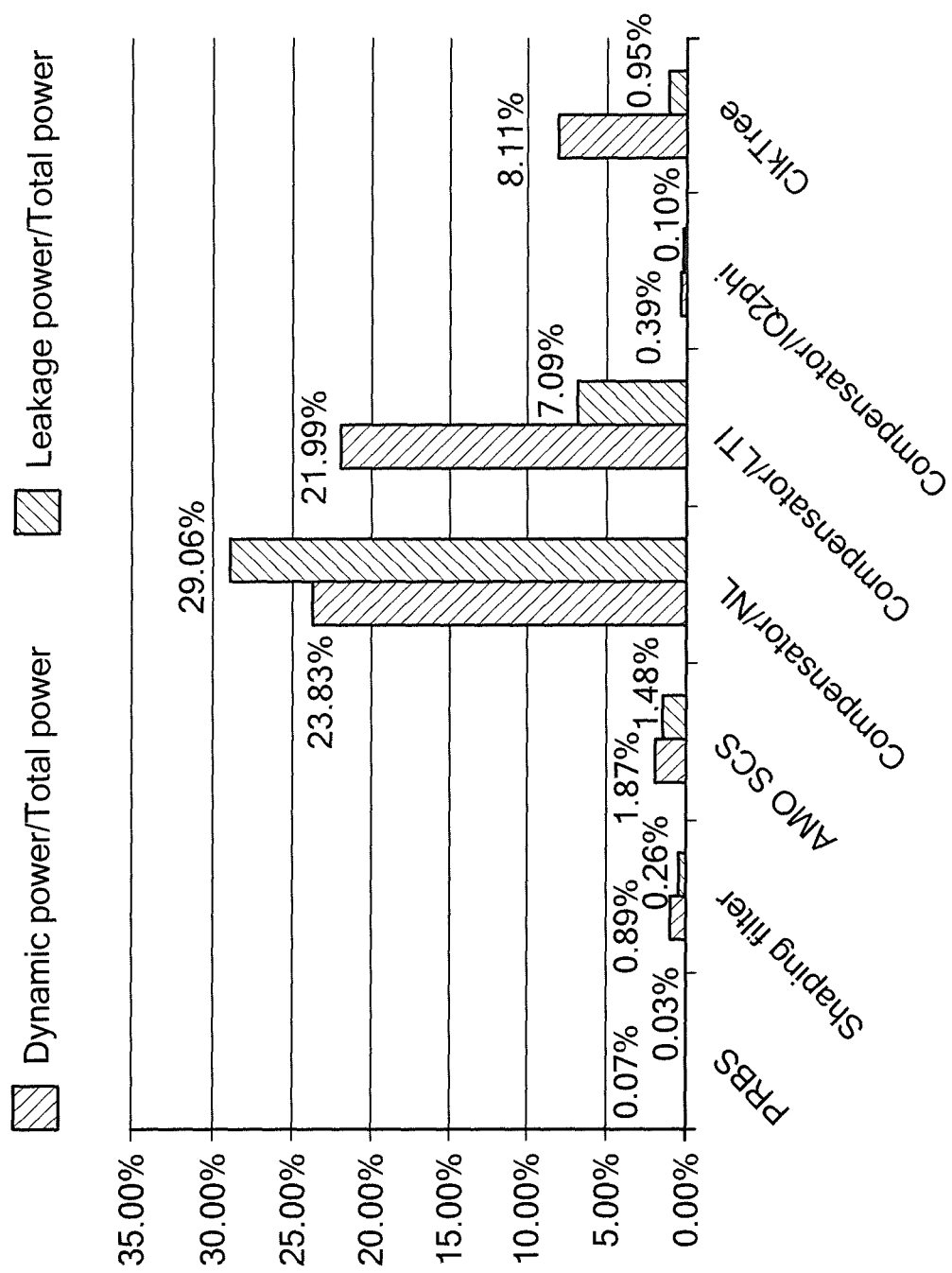
FIG. 32 is a bar graph illustrating an exemplary power breakdown for various components of an AMO system having a nonlinear compensator.

FIG. 32 shows the power breakdown of the overall system in accordance with an embodiment. As shown, the compensator's two major blocks dominate the power consumption. A significant amount of leakage power exists in the nonlinear transformation block of the compensator. This is due to a large LUT size, as well as the register-based LUT design. For the filtering block, dynamic power dominates because of the high activity of the FIR computation. In lab testing, the chip runs up to 500 MegaSamples/s with the power supply at 1.2V and power consumption of 2 W. Given that 30% of the power at 1 GigaSample/s throughput is leakage power (mostly due to a leaky register scan chain), a revised design with low-leakage scan registers would consume roughly 1 W at 500 MSamples/s. This represents a cost of 2 nJ/sample. For our target AMO PA with 5 W of output power and 20% peak-efficiency, this would represent a system with a total power-added efficiency of 19.2% with a penalty from baseband of less than 0.8%.

The outphasing amplifiers (e.g., LINC and AMO) are used herein as an example to show the strength of the digital compensation, even in such a complex analog system with nonlinearities happening along the whole signal chain. The digital compensation is able to generate the right set of inputs, so that the system yields an output that satisfies the linearity metrics. The introduction of the digital assistance to the analog system also helps relax the analog system blocks design specifications, such as the switch design, delay matching, etc. in the examples described herein.

One factor in the success of the digital compensator design is a detailed analysis of the system structure, leading to the right choice of model for the compensator. In the description herein, the feasibility of a successful compensator was first shown using an iterative simulation strategy. The effectiveness of the proposed dynamic model was then demonstrated. To achieve a fully integrated solution of a wideband mm-wave transmitter, the digital baseband was implemented with both SCS and compensation functionalities. This was further integrated with the analog frontend. It is believed that further reduction in area and power can be achieved by taking into account the large register-based LUTs.

The zero-avoidance filter (or level avoidance filter) may be designed to replace the shaping filter in the communication system. The original purpose of the shaping filter is to shape the spectrum with non-inter-symbol-interference (non-ISI) output sequence. The zero-avoidance filter (or level avoidance filter) will still achieve this purpose and in addition will serve to generate an output sequence with an absolute value away from certain positive thresholds. An embodiment is presented herein where, with heuristics, an output is achieved that has significantly fewer points in the "forbidden zone" as well as satisfying the spectrum specification and non-ISI property.

Figure 33:
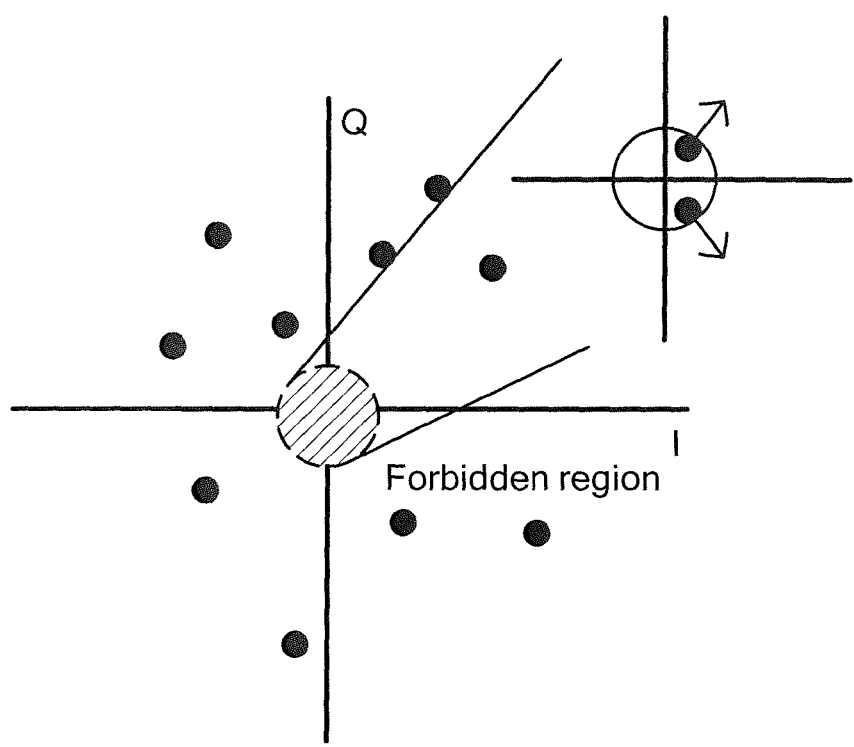
FIG. 33 is a plot illustrating a zero-avoidance zone.

The main idea of this design is to start with a normally shaped sample sequence, and select the samples that fall into the "forbidden region." The selected samples may then pass through another system in such a way that when added back, the new sample sequence yields fewer (or in the ideal case, no) points in the zone. FIG. 33 illustrates such a "forbidden zone" using crosshatching in the two-dimensional IQ plot. The goal is to move the violation points outside of the zone (as shown in the magnified portion in the upper right of FIG. 33).

Figure 34:
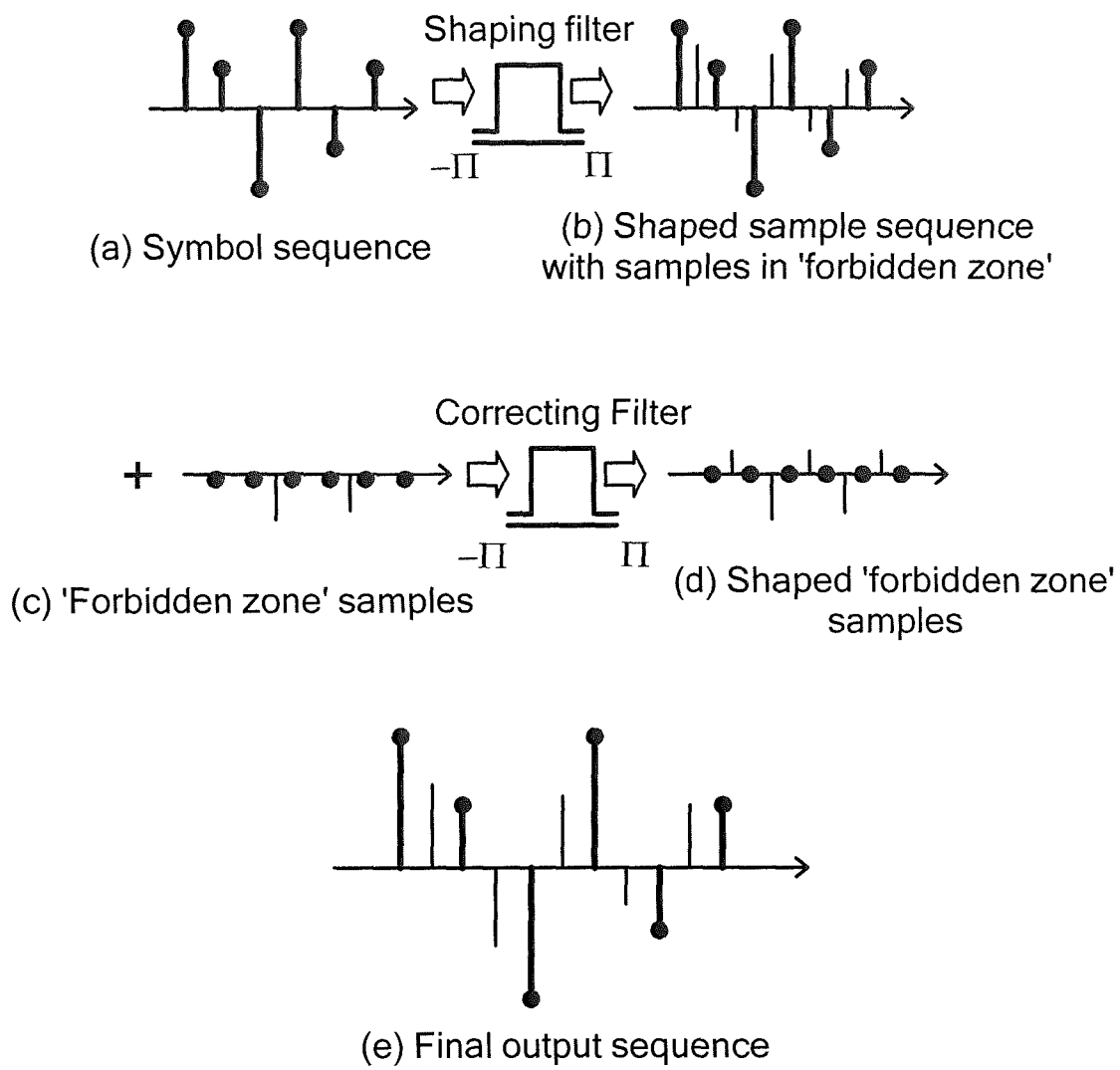
FIGS. 34A-34E are a series of plots illustrating an exemplary zero-avoidance filter design.

FIGS. 34(a)-(e) illustrate a zero-avoidance filter design technique in accordance with an embodiment. The original shaping filter is first used to generate the shaped samples from a symbol sequence, as shown in FIGS. 34(a) and (b), where the lines with dots denote the symbols. Then, according to a threshold that defines the "forbidden zone," samples in the zone may be selected. The selected samples form a sequence where all other samples are zero, as shown in FIG. 32(c). The newly selected sample sequence passes through a new filter, the "correcting filter," which generates a shaped "forbidden zone" sample sequence. In the exemplary embodiment, the correcting filter is designed with the same spectral and non-ISI constraints as the original shaping filter, therefore the generated "forbidden zone" sample sequence has no ISI and its spectrum meets the same spectral mask as the original shaped sample sequence. Finally, the shaped "forbidden zone" sample sequence is added back to the sample sequence out of the original shaping filter to generate the final output sequence, as shown in FIG. 34(e). This sequence still meets the non-ISI and spectral mask specification with fewer (or no) points in the "forbidden zone."

Figure 35:
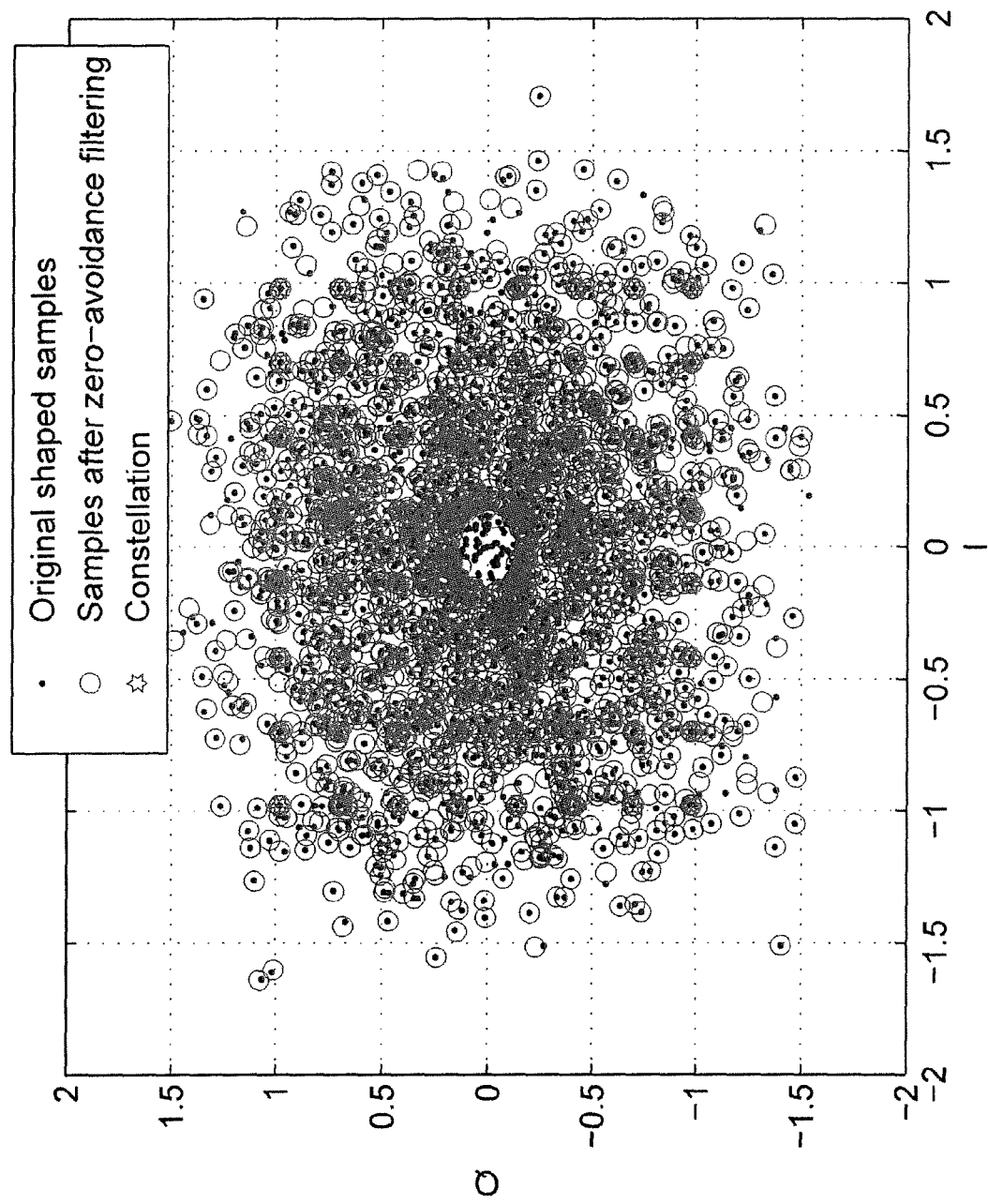
FIG. 35 is a plot illustrating exemplary results of a zero-avoidance filter.

FIG. 35 illustrates design results in accordance with an embodiment. The design results compare the original sampled sequence, a sequence after zero-avoidance filtering, and the constellation. As shown, the zero-avoidance sequence has fewer points in the zone, the radius of which is defined to be 12.7% of the constellation point with the largest amplitude. Quantitatively, the number of points in the zone is reduced from 89 out of 4096 samples to 43.

As has been seen from the techniques and results described herein, this heuristic method is effective. However, this technique is not guaranteed to move the samples out of the zone. It is believed that more effective zero-avoidance can be achieved by further developing these techniques.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims.

The invention claimed is:

1. An outphasing power amplification system comprising:
an input to receive a data sequence;
a shaping filter to shape pulses within the data sequence to control a spectrum thereof;
a signal component separator (SCS) to separate the shaped data sequence into first and second signal components, the first signal component including at least a first phase signal and the second signal component including at least a second phase signal;
first and second power amplifiers to amplify the first and second signal components, respectively;
a combiner to combine output signals of the first and second power amplifiers to generate an output signal of the outphasing power amplification system;
a compensator circuit coupled between the SCS and the first and second power amplifiers to adjust phases in the first phase signal and the second phase signal in a manner that linearizes operation of the outphasing power amplification system; and
a phase modulator coupled between the compensator and the first and second power amplifiers to modulate carrier signals using the compensated first and second phase signals, wherein the phase modulator is coupled to deliver the modulated carrier signals to respective ones of the first and second power amplifiers;
wherein the compensator circuit includes a first stage and a second stage, the first stage to provide non-linear transformations to the first and second signal components generated by the SCS and the second stage to provide linear time invariant (LTI) transformations to the output signals of the first stage, the LTI transformations having discontinuities at ±π, wherein the second stage outputs the compensated first and second phase signals to the phase modulator.

2. The outphasing power amplification system of claim 1, wherein:
the first stage of the compensator circuit includes relatively short memory and the second stage of the compensator circuit includes relatively long memory.

3. The outphasing power amplification system of claim 1, wherein:
the first stage of the compensator circuit includes first circuitry to provide a first non-linear transformation to the first signal component and second circuitry to provide a second non-linear transformation to the second signal component; and
the second stage includes third circuitry having at least one complex-valued finite impulse response (FIR) filter to process signals received from the first circuitry of the first stage and at least one complex valued FIR filter to process signals received from the second circuitry of the first stage.

4. The outphasing power amplification system of claim 3, wherein:
the first signal component includes the first phase signal and a first amplitude signal and the second signal component includes the second phase signal and a second amplitude signal;
the first circuitry includes a tapped delay line having at least one tap to delay an amplitude value of the first amplitude signal and a phase value of the first phase signal to generate at least one previous amplitude value and at least one previous phase value, wherein the first non-linear transformation acts upon the amplitude value of the first amplitude signal, the phase value of the first phase signal, the at least one previous amplitude value of the first amplitude signal, and the at least one previous phase value of the first phase signal; and
the second circuitry includes a tapped delay line having at least one tap to delay an amplitude value of the second amplitude signal and a phase value of the second phase signal to generate at least one previous amplitude value and at least one previous phase value, wherein the second non-linear transformation acts upon the amplitude value of the second amplitude signal, the phase value of the second phase signal, the at least one previous amplitude value of the second amplitude signal, and the at least one previous phase value of the second phase signal.

5. The outphasing power amplification system of claim 3, wherein:
the third circuitry includes a first upsampler to upsample signals received from the first circuitry of the first stage and a second upsampler to upsample signals received from the second circuitry of the first stage, wherein a first complex-valued FIR filter is coupled to an output of the first upsampler and a second complex-valued FIR filter is coupled to an output of the second upsampler.

6. The outphasing power amplification system of claim 5, wherein the third circuitry further comprises:
a first summer to sum real components output by the first and second complex-valued FIR filters;
a first low pass filter to filter an output signal of the first summer;
a first downsampler to downsample an output signal of the first low pass filter;
a second summer to sum imaginary components output by the first and second complex-valued FIR filters;
a second low pass filter to filter an output signal of the second summer; and
a second downsampler to downsample an output signal of the second low pass filter.

7. The outphasing power amplification system of claim 6, wherein:
the first and second complex-valued FIR filters include short tap filters and the first and second low pass filters include long tap filters.

8. The outphasing power amplification system of claim 6, wherein:
the first and second low pass filters include brick wall filters.

9. The outphasing power amplification system of claim 3, wherein:
the first circuitry includes circuitry to provide multiple different non-linear transformations to the first signal component and the second circuitry includes circuitry to provide multiple different non-linear transformations to the second signal component, the multiple different non-linear transformations to account for different singular value decomposition (SVD) modes.

10. The outphasing power amplification system of claim 3, wherein:
the first circuitry implements the first non-linear transformation as a piecewise linear approximation in two dimensions and the second circuitry implements the second non-linear transformation as a piecewise linear approximation in two dimensions.

11. The outphasing power amplification system of claim 3, wherein:
the first circuitry implements the first non-linear transformation using trigonometric polynomials and the second circuitry implements the second non-linear transformation using trigonometric polynomials.

12. The outphasing power amplification system of claim 3, wherein:
the compensation circuit is capable of achieving multi-Gigasample per second throughput.

13. The outphasing power amplification system of claim 3, wherein:
the outphasing power amplification system is one of the following: a linear amplification using non-linear components (LINC) power amplification system or an asymmetric multilevel outphasing (AMO) power amplification system.

14. The outphasing power amplification system of claim 1, wherein:
the first and second power amplifiers are non-linear power amplifiers.

15. The outphasing power amplification system of claim 1, wherein:
the shaping filter includes a zero avoidance filter or a level avoidance filter to avoid input sample amplitudes to the SCS that would fail a convergence criterion.

16. The outphasing power amplification system of claim 1, wherein:
the outphasing power amplification system is configured as a linear amplification using non-linear components (LINC) power amplification system; and
the shaping filter includes a zero avoidance filter to avoid input sample amplitudes to the SCS around zero.

17. The outphasing power amplification system of claim 1, wherein:
the outphasing power amplification system is configured as an asymmetric multilevel outphasing (AMO) power amplification system; and
the shaping filter includes a level avoidance filter that avoids several different input sample amplitudes to the SCS.

18. A compensation circuit for improving linearity in outphasing power amplification systems, the compensation circuit to be placed between a signal component separator (SCS) and first and second power amplifiers of an outphasing power amplification system to adjust phases of first and second phase signals to be input to the first and second power amplifiers, the compensation circuit comprising:
a first stage coupled to receive first and second signal components output by the SCS, the first stage including first circuitry to provide a first non-linear transformation to the first signal component and second circuitry to provide a second non-linear transformation to the second signal component, the first signal component including at least a first phase signal and the second signal component including at least a second phase signal; and
a second stage coupled to receive output signals of the first stage, the second stage including third circuitry to apply linear time invariant (LTI) transformations to the output signals of the first stage to generate corrected phase signals for the first and second power amplifiers, the LTI transformations having discontinuities at $\pm\pi$, wherein the third circuitry includes at least one complex-valued finite impulse response (FIR) filter to process signals received from the first circuitry of the first stage and at least one complex valued FIR filter to process signals received from the second circuitry of the first stage;
wherein the first stage has relatively short memory and the second stage has relatively long memory.

19. The compensation circuit of claim 18, wherein:
the first signal component includes the first phase signal and a first amplitude signal and the second signal component includes the second phase signal and a second amplitude signal;
the first circuitry includes a tapped delay line having at least one tap to delay an amplitude value of the first amplitude signal and a phase value of the first phase signal to generate at least one previous amplitude value and at least one previous phase value, wherein the first non-linear transformation acts upon the amplitude value of the first amplitude signal, the phase value of the first phase signal, the at least one previous amplitude value of the first amplitude signal, and the at least one previous phase value of the first phase signal; and
the second circuitry includes a tapped delay line having at least one tap to delay an amplitude value of the second amplitude signal and a phase value of the second phase signal to generate at least one previous amplitude value and at least one previous phase value, wherein the second non-linear transformation acts upon the amplitude value of the second amplitude signal, the phase value of the second phase signal, the at least one previous amplitude value of the second amplitude signal, and the at least one previous phase value of the second phase signal.

20. The compensation circuit of claim 18, wherein:
the third circuitry includes a first upsampler to upsample signals received from the first circuitry of the first stage and a second upsampler to upsample signals received from the second circuitry of the first stage, wherein a first complex-valued FIR filter is coupled to an output of the first upsampler and a second complex-valued FIR filter is coupled to an output of the second upsampler.

21. The compensation circuit of claim 20, wherein the third circuitry further comprises:
a first summer to sum real components output by the first and second complex-valued FIR filters;
a first low pass filter to filter an output signal of the first summer;
a first downsampler to downsample an output signal of the first low pass filter;
a second summer to sum imaginary components output by the first and second complex-valued FIR filters;
a second low pass filter to filter an output signal of the second summer; and
a second downsampler to downsample an output signal of the second low pass filter.

22. The compensation circuit of claim 21, wherein:
the first and second complex-valued FIR filters include short tap filters and the first and second low pass filters include long tap filters.

23. The compensation circuit of claim 21, wherein:
the first and second low pass filters include brick wall filters.

24. The compensation circuit of claim 18, wherein:
the first circuitry includes circuitry to provide multiple different non-linear transformations to the first signal component and the second circuitry includes circuitry to provide multiple different non-linear transformations to the second signal component, the multiple different non-linear transformations to account for different modes.

25. The compensation circuit of claim 18, wherein:
the first circuitry implements the first non-linear transformation as a piecewise linear approximation in two dimensions and the second circuitry implements the second non-linear transformation as a piecewise linear approximation in two dimensions.

26. The compensation circuit of claim 18, wherein:
the first circuitry implements the first non-linear transformation using trigonometric polynomials and the second circuitry implements the second non-linear transformation using trigonometric polynomials.

27. The compensation circuit of claim 18, wherein:
the compensation circuit is capable of achieving multi-Gigasample per second throughput.

28. The compensation circuit of claim 18, wherein:
the compensation circuit can be used with both linear amplification using non-linear components (LINC) power amplification systems and asymmetric multi-level outphasing (AMO) power amplification systems.

* * * * *

UNITED STATES PATENT AND TRADEMARK OFFICE
CERTIFICATE OF CORRECTION

PATENT NO. : 9,595,920 B2  
APPLICATION NO. : 14/760284  
DATED : March 14, 2017  
INVENTOR(S) : Yehuda Avniel et al.

Page 1 of 1

It is certified that error appears in the above-identified patent and that said Letters Patent is hereby corrected as shown below:

In the Specification

Column 4, Line 17, delete "(LING)" and replace with --(LINC)--

Column 4, Line 28, delete "(LING)" and replace with --(LINC)--

Column 8, Line 24, delete "(LING)" and replace with --(LINC)--

Column 14, Line 2, delete "LING" and replace with --LINC--

In the Claims

Column 27, Line 42, Claim 16 delete "(LING)" and replace with --(LINC)--

Signed and Sealed this  
Fourth Day of June, 2019

Andrei Iancu  
*Director of the United States Patent and Trademark Office*